(12) United States Patent
Hotta

(10) Patent No.: US 6,887,744 B2
(45) Date of Patent: May 3, 2005

(54) METHOD OF FORMING A THIN FILM TRANSISTOR SUBSTRATE WITH A INTERCONNECTION ELECTRODE

(75) Inventor: Kazushige Hotta, Kawasaki (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 58 days.

(21) Appl. No.: 10/314,892

(22) Filed: Dec. 9, 2002

(65) Prior Publication Data

US 2003/0153110 A1 Aug. 14, 2003

(30) Foreign Application Priority Data

Dec. 18, 2001 (JP) ......................................... 2001-383930

(51) Int. Cl.[7] .......................... H01L 21/00; H01L 21/20; H01L 21/44
(52) U.S. Cl. ........................... 438/151; 438/97; 438/98; 438/149; 438/151; 438/166; 438/488; 438/597; 438/652; 438/666
(58) Field of Search ............................ 438/97, 98, 149, 438/151, 166, 488, 597, 652, 666

(56) References Cited

U.S. PATENT DOCUMENTS

| | | | | |
|---|---|---|---|---|
| 5,585,951 A | * | 12/1996 | Noda et al. ................. 349/122 |
| 5,985,701 A | | 11/1999 | Takei et al. ................. 438/154 |
| 6,001,714 A | * | 12/1999 | Nakajima et al. ........... 438/525 |
| 6,118,505 A | * | 9/2000 | Nagata et al. .............. 349/106 |
| 6,466,280 B1 | * | 10/2002 | Park et al. .................... 349/43 |
| 6,515,336 B1 | * | 2/2003 | Suzawa et al. ............. 257/350 |
| 6,646,287 B1 | * | 11/2003 | Ono et al. .................... 257/66 |
| 2002/0130324 A1 | * | 9/2002 | Song et al. .................... 257/72 |

FOREIGN PATENT DOCUMENTS

| | | |
|---|---|---|
| JP | 58-216285 | 12/1983 |
| JP | 6-59279 | 3/1994 |
| JP | 7-239481 | 9/1995 |
| JP | 8-242001 | 9/1996 |
| JP | 9-298304 | 11/1997 |
| JP | 10-31227 | 3/1998 |

* cited by examiner

Primary Examiner—John F. Niebling
Assistant Examiner—Stanetta Isaac
(74) Attorney, Agent, or Firm—Greer, Burns & Crain, Ltd.

(57) ABSTRACT

A thin film transistor substrate including a semiconductor layer having a source region and a drain region, an insulating film and a gate electrode which are formed on the semiconductor layer, an interlayer insulating film which is a film stack with mutually different dielectric constants and which covers the gate electrode, a source region contact hole and a drain region contact hole which are formed on the interlayer insulating film, a pixel electrode connected to the source region through the source region contact hole, a first conductive film connected to the drain region through the drain region contact hole and formed of the same film as that of the pixel electrode, and a second conductive film connected to the drain region through the first conductive film.

5 Claims, 17 Drawing Sheets

N-Channel TFT Region    P-Channel TFT Region

Example of the Bus Line Light Shielding

TFT Region        Gate Busline Region

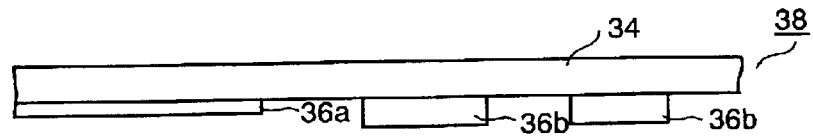
FIG. 9E
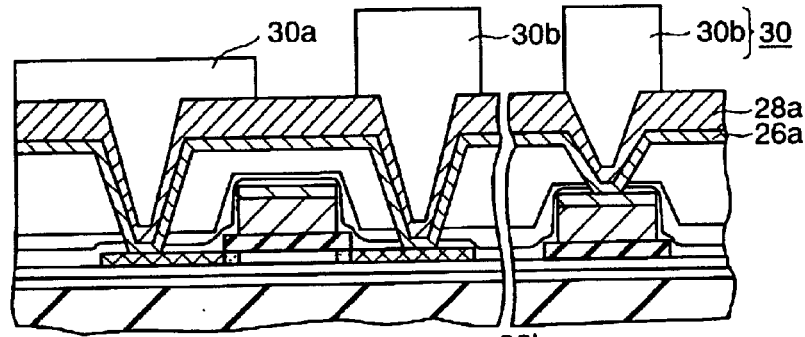
FIG. 9F
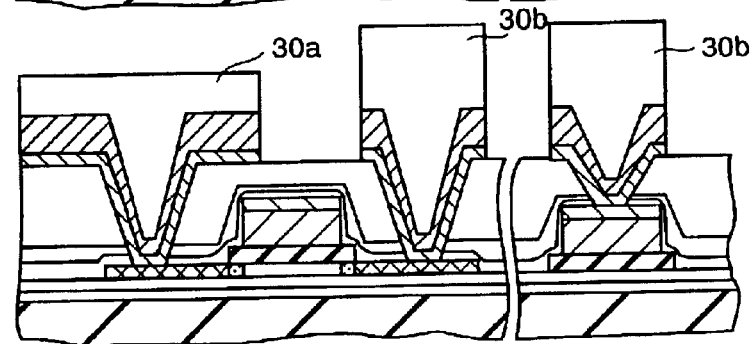
FIG. 9G
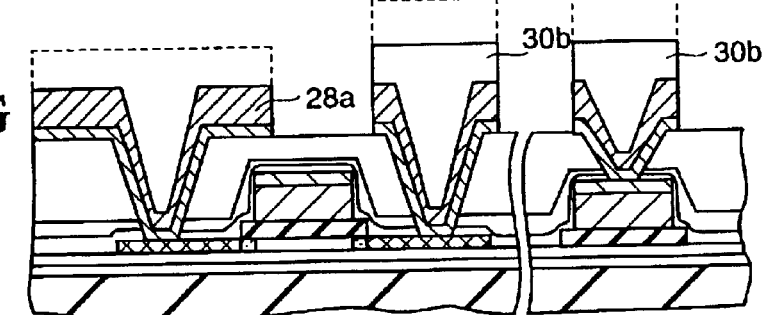
FIG. 9H
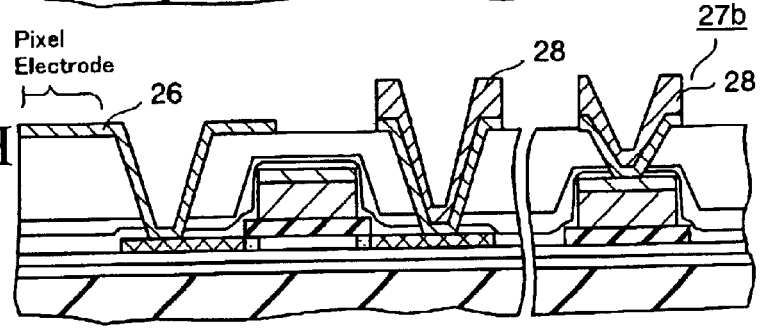

FIG. 12A  N-Channel TFT Region  P-Channel TFT Region
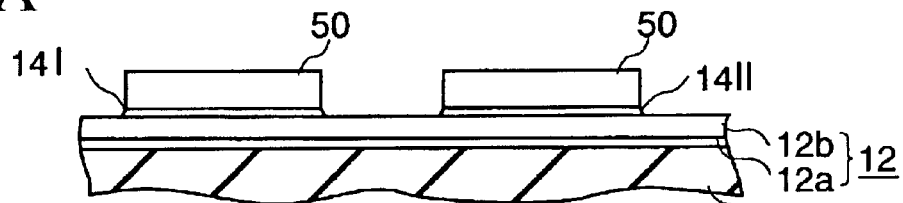
FIG. 12B
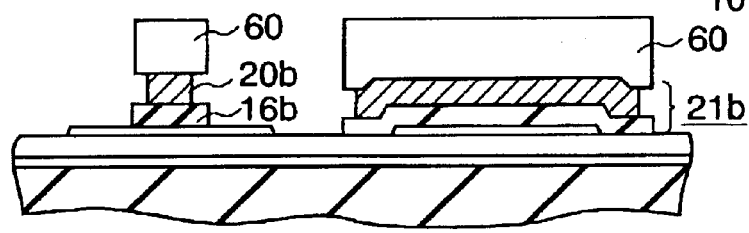
FIG. 12C
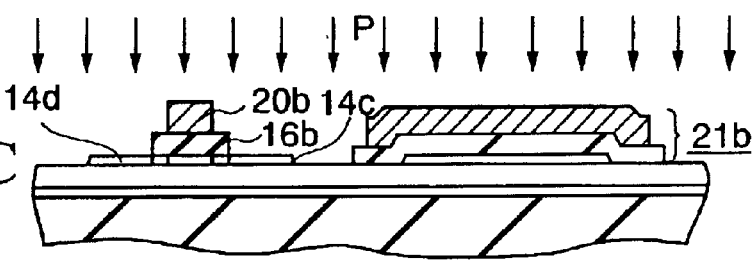
FIG. 12D
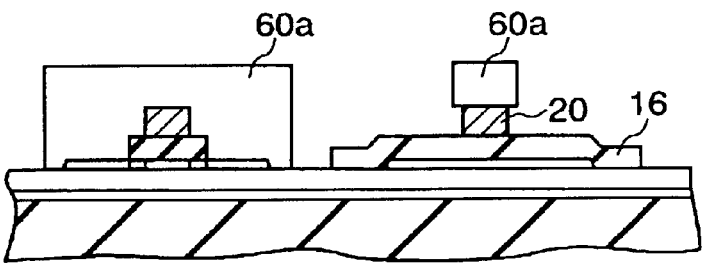
FIG. 12E
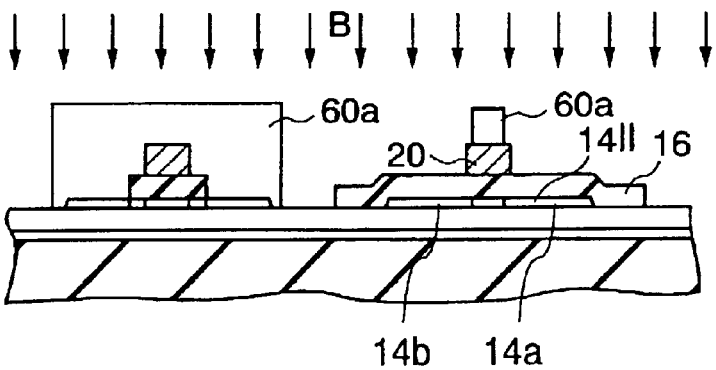

METHOD OF FORMING A THIN FILM TRANSISTOR SUBSTRATE WITH A INTERCONNECTION ELECTRODE

CROSS-REFERENCE TO RELATED APPLICATIONS

This application is based upon and claims priority of Japanese Patent Application No. 2001-383930, filed in Dec. 18, 2001, the contents being incorporated herein by reference.

BACKGROUND OF THE INVENTION

1) Field of the Invention

The present invention relates to a thin film transistor substrate and a method of manufacturing the same, and more specifically, to a thin film transistor substrate having a thin film transistor using a polycrystalline silicon film for an active layer and a method of manufacturing the same.

2) Description of the Prior Art

A liquid crystal display panel has advantages of being thin, light weight, and capable of being driven at a low voltage to consume low power, and is therefore widely used in various electronics. In particular, an active matrix liquid crystal panel, in which a switching element such as a thin film transistor (TFT) element is provided for each pixel, is as excellent as a cathode-ray tube (CRT) in display quality. Accordingly, the active matrix liquid crystal panel is used for a display of a portable television, a personal computer or the like.

A twisted nematic (TN) type liquid crystal display panel generally has a structure in which liquid crystal is filled between two transparent glass substrates. Of two surfaces (opposite surfaces) of the glass substrates, which are opposite to each other, on one surface, a black matrix, a color filter, a common electrode and the like are formed. Moreover, on the other surface, a TFT element, a pixel electrode and the like are formed. Furthermore, on surfaces reverse to the opposite surfaces of the glass substrates, polarizing plates are attached, respectively.

The two polarizing plates are arranged so that polarizing axes thereof are perpendicular to each other for example, and thus the liquid crystal display panel operates in a mode in which light is transmitted therethrough without an electric field applied thereto and is shielded with an electric field applied thereto, that is, a normally white mode. Meanwhile, when the polarizing axes of the two polarizing plates are parallel to each other, the liquid crystal display panel operates in a mode in which light is shielded without an electric field applied thereto and is transmitted therethrough with an electric field applied thereto, that is, a normally black mode.

Incidentally, in recent years, a polycrystalline silicon (polysilicon) TFT tends to be used instead of an amorphous silicon TFT. Since current carriers in an amorphous silicon TFT have low mobility, it is required that a driver IC for driving pixel electrodes be separately prepared and connected to a TFT substrate. On the other hand, since current carriers in a polysilicon TFT have high mobility, a driver IC can be formed integrally with TFTs for pixels on the TFT substrate. Accordingly, there is an advantage in that a necessity of separately preparing a driver IC is eliminated to make it possible to reduce cost of the liquid crystal panel and the like.

(A Method of Manufacturing a Polysilicon TFT Substrate According to the Prior Art (1))

FIGS. 1A to 1E are cross sectional views showing a method of manufacturing a polysilicon TFT substrate according to a prior art (1). As shown in FIG. 1A, in the method of manufacturing a polysilicon TFT substrate according to the prior art (1), to begin with, a silicon nitride film (a SiN film) 102 with a thickness of 50 nm and a silicon oxide film (a $SiO_2$ film) 104 with a thickness of about 100 nm are sequentially deposited from bottom to top on a transparent insulating substrate 100 made of a material such as glass to form a buffer layer 106. Note that the SiN film 102 functions as a blocking film to prevent diffusion of impurities into a TFT from the transparent insulating substrate 100.

Next, a semiconductor layer such as a polysilicon film is deposited on the buffer layer 106, and then the semiconductor layer is patterned into an island shape by photo etching, thus forming a semiconductor layer pattern 108 (mask process (1)).

Next, as shown in FIG. 1B, a $SiO_2$ film and an aluminum film (an Al film) are sequentially formed from bottom to top on the semiconductor layer pattern 108 and the buffer layer 106. Subsequently, the $SiO_2$ film and the Al film are patterned by photo etching, thus forming a gate insulating film 110, a gate electrode 112 and a gate busline 112a (mask process (2)).

Next, as shown in FIG. 1C, $P^+$ (phosphorous) ions are implanted into the semiconductor layer pattern 108 by use of the gate electrode 112 as a mask, thereby forming a source region 108a and a drain region 108b of an N channel TFT.

When a peripheral circuit such as a driver is formed of CMOS circuits integrally on the transparent insulating substrate 100, to begin with, $P^+$ ions are implanted into the entire surface of the transparent insulating substrate 100 to form source regions and drain regions of N channel TFTs. Subsequently, regions where the N channel TFTs for pixels and a peripheral circuit are to be formed are covered with a mask such as a resist film, and then impurities such as $B^+$ (boron) ions are selectively implanted into regions where P channel TFTs of the peripheral circuit are to be formed at a dose two or more times as high as a dose of the $P^+$ ions. In such a manner, source regions and drain regions of the N channel TFTs and the P channel TFTs are formed (mask process (2a)).

Next, as shown in FIG. 1D, an interlayer insulating film 116 made of a $SiO_2$ film with a thickness of 300 nm is formed on the gate electrode 112, gate busline 112a and the semiconductor layer pattern 108. Subsequently, the interlayer insulating film 116 is provided with openings on the source region 108a, the drain region 108b and the gate busline 112a by photo etching, thus forming contact holes 116a (mask process (3)).

Subsequently, a molybdenum (Mo) film with a thickness of 300 nm is deposited on the interlayer insulating film 116, and then the Mo film is patterned by photo etching, thereby forming interconnection electrodes 118 (mask process (4)). In this way, the interconnection electrodes 118 are respectively connected to the source region 108a and the drain region 108b of the semiconductor layer pattern 108, and to the gate busline 112a.

Next, as shown in FIG. 1E, a passivation film 120 made of a silicon nitride (SiN) film with a thickness of 300 nm is formed, and then the passivation film 120 is provided with openings on the interconnection electrodes 118 connected to the source region 108a and the gate busline 112a, thus forming second contact holes 120a (mask process (5)). Note that the passivation film 120 functions as a blocking film to prevent movable ions such as Na ions penetrating from an outside from diffusing into the TFT.

Next, an ITO (indium tin oxide) film is deposited on the passivation film 120, and then the ITO film is patterned by photo etching, thus forming a pixel electrode 122 electrically connected to the source region 108a through the interconnection electrode 118 (mask process (6)). Simultaneously with the foregoing, an ITO film 122a of the same layer as that of the pixel electrode 122 is formed on the interconnection electrode 118 connected to the gate busline 112a.

As described above, in order to manufacture a conventional polysilicon TFT substrate, when only N channel TFTs are formed, at least six mask processes are required. Meanwhile, when CMOS circuits are formed, at least seven mask processes are required. Note that each mask process includes eight subprocesses as follows: 1) substrate cleaning; 2) photo resist coating; 3) drying; 4) exposure; 5) development; 6) baking; 7) thin film etching or impurity ion implantation; and 8) resist removal.

(A Method of Manufacturing a Polysilicon TFT Substrate According to the Prior Art (2))

FIGS. 2A to 2I are cross sectional views showing a method of manufacturing a polysilicon TFT substrate according to a prior art (2). The method of manufacturing a polysilicon TFT substrate according to the prior art (2) relates to a method of manufacturing a TFT substrate in which a pixel TFT has a light doped drain (LDD) structure in order to suppress an off state current and a peripheral circuit is composed of CMOS TFTs in order to lower electric power consumption.

In the method of manufacturing a polysilicon TFT substrate according to the prior art (2), as shown in FIG. 2A, to begin with, a SiN underlayer 202 and a $SiO_2$ underlayer 204 are sequentially formed from bottom to top on a transparent insulating substrate 200. Subsequently, an amorphous silicon (a-Si) film is deposited on the $SiO_2$ underlayer 204, and then the a-Si film is crystallized by laser and converted into a polysilicon (p-Si) film. Next, a resist film 208 is patterned on the p-Si film, and then the p-Si film is etched by use of the resist film 208 as a mask, thus forming island shaped p-Si film patterns 206 (mask process (1)).

Next, as shown in FIG. 2B, after removing the resist film 208, a gate insulating film and a first conductive film are sequentially formed from bottom to top on the p-Si film patterns 206 and the $SiO_2$ underlayer 204. Subsequently, a resist film 208a for delimiting gate electrodes is patterned on the first conductive film, and then the first conductive film and the gate insulating film are etched by use of the resist film as a mask, thus obtaining the gate electrode 212 and the gate insulating film 210 (mask process (2)). In this event, the gate electrode 212 is formed so as to be narrower than a width of the gate insulating film 210 due to side etching.

Next, as shown in FIG. 2C, a resist film 208b is patterned on a region for a P channel TFT, and then $P^+$ ions are selectively implanted into a region in which an N channel TFT is to be formed with an ion doping system by use of the resist film 208b as a mask. In this event, $P^+$ ion implantation is performed by use of the gate electrode 212 and the gate insulating film 210 as a mask under a doping condition in which accelerating energy is low, thus forming high concentration impurity regions ($n^+$ layer) in portions of the p-Si film pattern 206 which are outside both edges of the gate insulating film 210.

Subsequently, $P^+$ ion implantation is performed through the gate insulating film 210 with an ion doping system by use of the gate electrode as a mask under a condition in which accelerating energy is high, thereby forming low concentration impurity regions ($n^-$ layer) in portions of the p-Si film pattern 206 which are outside both edges of the gate electrode 212 and directly under the gate insulating film 210. In this way, a source region 206a and a drain region 206b of the N channel TFT are formed, and an LDD structure of the N channel TFT, in which an $n^-$ layer is provided between a channel and the drain region 206b, is also formed.

Next, after removing the resist film 208b, as shown in FIG. 2D, the region for the N channel TFT is masked with a resist film 208c, and then $B^+$ ion doping is performed with an ion doping system (mask process (4)).

In this event, B+ion implantation is performed by use of the gate electrode 212 and the gate insulating film 210 as a mask under a condition in which accelerating energy is low, thereby forming high concentration impurity regions ($p^+$ layer) in portions of the p-Si film pattern 206 which are outside both edges of the gate insulating film 210. Subsequently, $B^+$ ion implantation is performed through the gate insulating film 210 by use of the gate electrode as a mask under a doping condition in which accelerating energy is high, thereby forming low concentration impurity regions ($p^-$ layer) in portions of the p-Si film pattern 206 which are outside both edges of the gate electrode 212 and directly under the gate insulating film 210. In this way, a source region 206c and a drain region 206d of the P channel TFT are formed, and an LDD structure of the P channel TFT is also formed.

Next, as shown in FIG. 2E, the $B^+$ ions and the $P^+$ ions, which are implanted into the p-Si film patterns 206, are activated by irradiating excimer laser or the like.

After performing the activation of impurities, as shown in FIG. 2F, a $SiO_2$ film 210a and a SiN film 210b are sequentially deposited from bottom to top to form a first interlayer insulating film 210. Subsequently, a resist film 208d is patterned on the first interlayer insulating film 210, and then the first interlayer insulating film 210 is provided with openings on the source region 206a and the drain region 206b of the N channel TFT and the source region 206c and the drain region 206d of the P channel TFT by etching using the resist film 208d as a mask, thus forming first contact holes 211 (mask process (5)).

Next, as shown in FIG. 2G, a second conductive film is deposited on the first interlayer insulating film 210, a resist film 208e is patterned on the second conductive film, and the second conductive film is etched by use of the resist film 208e as a mask, thus forming interconnection electrodes 212 (mask process (6)).

Next, after removing the resist film 208d, as shown in FIG. 2H, a second interlayer insulating film 214 is deposited, and the second interlayer insulating film 214 is patterned on the source region 206a of the N channel TFT, thus forming a second contact hole 214a (mask process (7)).

Next, as shown in FIG. 2I, an ITO film is deposited on the second interlayer insulating film 214, and then the ITO film is patterned by photo etching, thereby forming a pixel electrode 216 electrically connected to the source region 206a of the N channel TFT through the interconnection electrode 212 (mask process (8)).

As described above, in the method of manufacturing a polysilicon TFT substrate according to the prior art (2), at least eight mask processes are required.

(A Method of Manufacturing a Polysilicon TFT Substrate According to a Prior Art (3)).

FIGS. 3A and 3B are cross sectional views showing the method of manufacturing a polysilicon TFT substrate according to the prior art (3). In the method of manufacturing a polysilicon TFT substrate according to the prior art (3), the number of mask processes is reduced by one using counter doping as compared to the above-described prior art (2).

To begin with, by a method similar to the method of manufacturing a polysilicon TFT substrate of the prior art (2), the same structure as that of FIG. 2B is obtained. Next, after removing a resist film 208a, as shown in FIG. 3A, with an ion doping system, P$^+$ ions are implanted into the entire surface of a transparent insulating substrate 200 without patterning a resist film. In this event, by a method similar to the method of manufacturing a polysilicon TFT substrate of the prior art (2), a source region 206a and a drain region 206b of an N channel TFT having an LDD structure are formed. Simultaneously with the foregoing, P$^+$ ions are implanted also into a p-Si film pattern 206 of a region for a P channel TFT, and a conductivity type of the implanted region is made to be n-type.

Next, as shown in FIG. 3B, a region for the N channel TFT is masked with a resist film 208f, and then B$^+$ ions are implanted into the region for the P channel TFT at a dose two or more times as high as a dose of the above-described P$^+$ ions, thereby converting a conductivity type of the n-type p-Si film pattern 206 into p-type. Thus, a source region 206c and a drain region 206d of the P channel TFT are formed. In this event, B$^+$ ion implantation is performed under an ion doping condition in which an LDD structure is formed also in the P channel TFT.

Next, after removing the resist film 208f, a polysilicon TFT substrate is manufactured by a method similar to the above-described method of manufacturing a polysilicon TFT substrate according to the prior art (2).

In the above-described method of manufacturing a polysilicon TFT substrate according to the prior art (1), at least six mask processes are required. With an increase in the number of mask processes, the number of fabrication processes is inevitably increased. Accordingly, enormous equipment investment is required, thus causing an increase in fabrication cost.

Moreover, in order to realize high speed operation by reducing load capacitance of peripheral circuits for driving TFTs for pixels, interlayer capacitance between the gate electrode 112 and the interconnection electrodes 118 is required to be reduced as small as possible.

Furthermore, an aperture ratio tends to be smaller owing to the fact that a liquid crystal display panel comes to have higher resolution. Therefore, an image on the liquid crystal display panel tends to become darker. As a countermeasure to the foregoing, a so-called bus line light shielding method is used. In the bus line light shielding method, pixel electrodes are extended above data bus lines and gate bus lines, which delimit pixels, and regions between the pixels are shielded by the bus lines. FIG. 4 is a cross sectional view showing an example of the bus line light shielding.

As shown in FIG. 4, in a cross section structure of a portion including a polysilicon TFT element 119 in the bus line light shielding method, a buffer layer 106 is formed on a glass substrate 100, and a p-Si film 108 is formed on the buffer layer 106. Moreover, a gate electrode (a gate bus line) 112 is formed on the p-Si film 108 interposing a gate insulating film 110 therebetween.

The polysilicon TFT 119 is thus composed, and a source region 119a of the polysilicon TFT 119 is connected to an interconnection electrode 118 formed of the same layer as that of a data bus line 118 through a second contact hole 121b formed in an interlayer insulating film 116. Moreover, a data bus line 118 is formed so as to extend on the gate electrode 112 interposing the interlayer insulating film 116 therebetween.

A passivation film 120 is formed on the data bus line 118, and a pixel electrode 122 connected to the interconnection electrode 118 through a third contact hole 120a formed in the passivation film 120 is formed. The pixel electrode 122 is formed so as to extend a position overlapping the gate electrode 112 and the data bus line 118. In this way, light shielding is heretofore performed by using the gate bus line 112 or the data bus line 118.

In a light shielding method in which a CF (color filter) substrate is provided with a black matrix, a deviation between a TFT substrate and the CF substrate due to mask alignment deviation needs to be considered in a range about 3 to 5 μm. On the other hand, in the bus line light shielding method, since it is enough to consider only mask alignment deviation of the TFT substrate, the mask alignment errors can be made as small as 1 to 2 μm. Accordingly, an aperture ratio of the liquid crystal display panel becomes high, making it possible to obtain high contrast images.

In the bus line light shielding method, the pixel electrode and either the gate bus line 112 or the data bus line 118 is required to be formed with sandwiching the interlayer insulating film 116 and the passivation film 120. Therefore, parasitic capacitance therebetween tends to become large. Accordingly, by reducing the parasitic capacitance, coupling between the pixel and both the bus lines 112 and 118 is required to be reduced. Therefore, it is preferred that dielectric constants of the interlayer insulating film 116 and the passivation film 120 be reduced and thicknesses thereof be thickened.

The interlayer insulating film 116 and the passivation film 120 are respectively made of an SiO$_2$ film (dielectric constant: about 3.9) and a SiN film (dielectric constant: about 7), and the dielectric constant of the SiN film is considerably high. The passivation film 120 (the SiN film) is required to be used in order to block penetration of movable ions such as Na.

For example, in order to achieve interlayer capacitance equivalent to that of the SiO$_2$ film (thickness: 300 nm), a film stack structure of the SiO$_2$ film (thickness: 130 nm) and the SiN film (thickness: 300 nm) is required, and therefore the total thickness of the interlayer films becomes as thick as 430 nm.

In order to cope with a state in which interlayer capacitance is further lowered, the interlayer films, which are the interlayer insulating film 116 and the passivation film 120, are required to be thickened. However, when the interlayer insulating film 116 and the passivation film 120 are thickened, there arises a problem that step coverage of the interconnection electrode (the data bus line) 118 is deteriorated in the contact hole, and consequently, a contact failure tends to occur.

In the above-described method of manufacturing a polysilicon TFT substrate according to the prior art (2), eight mask processes are required to form a polysilicon TFT having an LDD structure. Accordingly, the number of fabrication processes is increased as similar to the method of manufacturing a polysilicon TFT substrate according to the prior art (1). Consequently, enormous equipment investment is required, thus causing an increase in fabrication cost.

In addition, in a mask process with ion implantation, since an altered layer is formed on a surface portion of resist, the resist cannot be removed only with a removal solution. Therefore, it is required to perform resist removal in combination with dry ashing, resulting in a problem of a decline of productivity.

In the above-described method of manufacturing a polysilicon TFT substrate according to the prior art (3), since the counter doping method is used for manufacturing CMOS TFTs, an ion implantation process for inverting a conductivity type from n-type to p-type is required. In the ion implantation process, a region for a N channel TFT is covered with a resist mask, and then p-type impurities are implanted into a region for a P channel TFT at a dose two or more times as high as a dose in a conventional method to invert a conductivity type from n-type to p-type. Accordingly, ion implantation takes a lot of time, thereby causing a decline of productivity.

Moreover, in the ion implantation process, impurities are implanted also into the resist mask at a dose two or more times as high as a dose in a typical method. Therefore, an altered layer, which is further difficult to remove, is formed on a surface portion of the resist film. Accordingly, dry ashing takes a lot of time, thereby causing a decline of productivity.

Note that Japanese Unexamined Patent Publication No. Hei6(1994)-59279 discloses a method in which a resist film is not used as a mask for ion implantation, because a resist film is altered by ion implantation and removal of the resist film becomes difficult. However, no consideration is given to improving productivity by forming an LDD structure without an increase in the number of mask processes and the like.

SUMMARY OF THE INVENTION

An object of the present invention is to provide a thin film transistor substrate which can reduce parasitic capacitance generated between conductive films and which can increase step coverage of a conductive film in a contact hole to obtain stable contact and a method of manufacturing the same. Moreover, another object of the present invention is to provide a method of manufacturing a thin film transistor substrate which can reduce the number of mask processes and therefore has high productivity.

The present invention relates to a thin film transistor substrate including: an insulating substrate; a semiconductor layer formed on or above the insulating substrate, the semiconductor layer including a source region and a drain region; a gate insulating film formed on the semiconductor layer; a gate electrode formed on the gate insulating film; an interlayer insulating film made of a film stack of a plurality of insulating films having mutually different dielectric constants, the interlayer insulating film covering the gate electrode and the semiconductor layer; a source region contact hole formed in the interlayer insulating film on the source region of the semiconductor layer; a drain region contact hole formed in the interlayer insulating film on the drain region of the semiconductor layer; a pixel electrode connected to the source region through the source region contact hole; a first conductive film connected to the drain region through the drain region contact hole, the first conductive film being formed of the same film as a film of the pixel electrode; and a second conductive film connected to the drain region through the first conductive film.

As described above, in a case where an interlayer insulating film is thickened in order to reduce interlayer capacitance, an aspect ratio of a contact hole is increased. Therefore, step coverage of a conductive film formed in the contact hole is deteriorated. Accordingly, there is an apprehension that a contact failure occurs.

According to the present invention, the second conductive film is electrically connected to the drain region through the first conductive film formed of the same film as that of the pixel electrode. In general, the first conductive film (for example, a transparent conductive film such as an ITO film and a $SnO_2$ film) to be the pixel electrode has a characteristic of being deposited in a state in which step coverage is good.

Accordingly, even in a case where thickening an interlayer insulating film causes an increase in an aspect ratio of a contact hole, the first conductive film is formed in the contact hole in a state in which step coverage is good. Therefore, even in a case where step coverage of the second conductive film is bad, the second conductive film is electrically connected to the drain region and the like through the first conductive film in a state in which contact resistance therebetween is low.

The above-described thin film transistor substrate may include: a gate busline formed of the same film as a film of the gate electrode; a gate busline region contact hole formed in the inter layer insulating film on the gate busline; a third conductive film connected to the gate busline through the gate busline region contact hole, the third conductive film being formed of the same film as the film of the pixel electrode; and a fourth conductive film connected to the gate busline through the third conductive film, the fourth conductive film being formed of the same film as the second conductive film.

Namely, the contact hole on the gate busline formed of the same film as that of the gate electrode may have a structure similar to the above-described structure.

In the above-described thin film transistor substrate, the interlayer insulating film may be made of an inorganic insulating film and a photosensitive resin insulating film, which are stacked from bottom to top.

For example, a film including a silicon nitride film is adopted as the inorganic insulating film, and a positive photosensitive resin is formed thickly as the resin insulating film, thereby making it possible to block movable ions and reduce interlayer capacitance. Moreover, the positive photosensitive resin can be provided with an opening by exposure and development. Accordingly, a gradual forward tapered shape is obtained, and therefore, step coverage of the conductive film in the contact hole is further improved.

Furthermore, the present invention relates to a method of manufacturing a thin film transistor substrate, including the steps of: forming patterns of a semiconductor layer for a one conductivity type channel transistor and a semiconductor layer for a opposite conductivity type channel transistor on or above an insulating substrate, forming a gate insulating film on the semiconductor layers, forming a conductive film, which is to be gate electrodes, on the gate insulating film, forming a structure in which a gate insulating film for the opposite conductivity type channel transistor and the gate electrode for the opposite conductivity type channel transistor, the gate electrode having a narrower width than a width of the gate insulating film for the opposite conductivity type channel transistor, are stacked from bottom to top on the semiconductor layer for the opposite conductivity type channel transistor, and forming a pattern of a covering film stack in which a gate insulating film and a conductive film are stacked, the covering film stack covering the semiconductor layer for the one conductivity type channel transistor, by patterning the conductive film and the gate insulating film, forming predetermined source and drain regions for the opposite conductivity type channel transistor by introducing impurities of the opposite conductivity type into the semiconductor layer for the opposite conductivity type channel transistor while using at least anyone of the gate electrode for the opposite conductivity type channel transistor and the gate insulating film therefor as a mask, forming a structure in which a gate insulating film for the one conductivity type channel transistor and the gate electrode for the one conductivity type channel transistor, the gate electrode having a narrower width than a width of the gate insulating film for the one conductivity type channel transistor, are stacked from bottom to top, by patterning the covering film stack, and forming predetermined source and drain regions for the one conductivity type channel transistor by introducing impurities of the one conductivity type into the semiconductor layer for the one conductivity type channel transistor while using at least anyone of the gate electrode for the one conductivity type channel transistor and the gate insulating film therefor as a mask.

For example, the present invention is performed by a method described as follows. Namely, to begin with, a stepwise structure is formed so that a width of a gate electrode for a P channel transistor is narrower than a width of a gate insulating film, and a region for an N channel transistor is covered with a covering film stack. Thereafter, p-type impurities are introduced into a semiconductor layer for the P channel transistor while using at least any one of the gate electrode of the P channel transistor and the gate insulating film thereof as a mask, thus forming source and drain regions for the P channel transistor. In this event, the gate electrode of the P channel transistor and the gate insulating film thereof collectively form a stepwise shape. Accordingly, predetermined p-type impurities may be introduced twice, thus forming an LDD structure. Moreover, it is preferred that a dose of the p-type impurities be set to a dose such that a conductivity type of the semiconductor layer for the P channel transistor is not inverted by n-type impurities for forming a source region of the N channel transistor and a drain region thereof.

Next, also in the region for the N channel transistor, as similar to the foregoing, a gate electrode and a gate insulating film collectively forming a stepwise shape are formed, and then n-type impurities are introduced into a semiconductor layer for the N channel transistor while using at least any one of the gate electrode of the N channel transistor and the gate insulating film thereof as a mask, thus forming the source region of the N channel transistor and the drain region thereof. Moreover, also in the N channel transistor, the gate insulating film and the gate electrode are formed into a stepwise shape. Accordingly, predetermined n-type impurities may be introduced twice under a predetermined condition, thus forming an LDD structure.

In this way, a process of introducing impurities by use of a resist film as a mask is eliminated in the impurity introducing process relating to fabrication of CMOS TFTs. Accordingly, there is no occurrence of the following disadvantage: an altered layer is formed in a surface portion of the resist film due to ion introduction, and removal of the resist film therefore takes a lot of time.

Moreover, though eight mask processes are required in a fabrication process of CMOS TFTs having LDD structures in the prior art (2), seven mask processes are enough for fabrication thereof in the embodiment. Therefore, production efficiency can be improved.

Furthermore, the present invention relates to a method of manufacturing a thin film transistor substrate, including the steps of: forming patterns of a semiconductor layer for a one conductivity type channel transistor and a semiconductor layer for a opposite conductivity type channel transistor on or above an insulating substrate, forming a gate insulating film on the semiconductor layers, forming a conductive film, which is to be gate electrodes, on the gate insulating film, forming the gate electrode for the opposite conductivity type channel transistor on the semiconductor layer for the opposite conductivity type channel transistor, and forming a pattern of a covering conductive film which covers the semiconductor layer for the one conductivity type channel transistor by patterning the conductive film, forming a source region and a drain region for the opposite conductivity type channel transistor by introducing impurities of the opposite conductivity type into the semiconductor layer for the opposite conductivity type channel transistor through the gate insulating film while using the gate electrode for the opposite conductivity type channel transistor as a mask, forming a structure in which a gate insulating film for the one conductivity type channel transistor and the gate electrode for the one conductivity type channel transistor, the gate electrode having a narrower width than a width of the gate insulating film for the one conductivity type channel transistor, are stacked from bottom to top, by patterning the covering conductive film and the gate insulating film, and forming predetermined source and drain regions for the one conductivity type channel transistor, by introducing impurities of the one conductivity type into the semiconductor layer for the one conductivity type channel transistor while using at least anyone of the gate electrode for the one conductivity type channel transistor and the gate insulating film therefor as a mask.

For example, the present invention is performed by a method described as follows. A gate electrode for a P channel TFT is formed so that a region for the N channel TFT is masked with a covering conductive film. In this event, a gate insulating film as an underlayer is not patterned. Next, p-type impurities are introduced through the gate insulating film while using the gate electrode for the P channel TFT as a mask, thus forming the P channel TFT having no LDD structure. It is preferred that a dose of the p-type impurities be set to a dose such that a conductivity type of the semiconductor layer for the P channel TFT is not inverted by n-type impurities for forming a source region of the N channel TFT and a drain region thereof.

Next, a gate electrode for the N channel TFT and a gate insulating film therefor are formed into a stepwise shape, and then n-type impurities are introduced into a semiconductor layer for the N channel TFT while using at least any one of the gate electrode for the N channel TFT and the gate insulating film therefor as a mask, thus forming the source region of the N channel TFT and the drain region thereof. In this event, n-type impurities may be introduced under a predetermined condition while using the stepwise shape of the gate electrode for the N channel TFT and the gate insulating film therefor, thus forming an LDD structure.

Since the P channel TFT is mainly used in peripheral circuits, the P channel TFT has no off-state leakage. Moreover, the P channel TFT is hardly deteriorated due to hot carriers. Accordingly, the P channel TFT does not always require an LDD structure. In the method of manufacturing a thin film transistor substrate of the present invention, the P channel TFT is not provided with an LDD structure. Therefore, a time for introducing p-type impurities can be shortened, thus improving production efficiency.

Moreover, in the present invention, the number of mask processes can be reduced by one as compared to the prior art (2). Furthermore, since ions are not introduced in a state in which a resist film is used as a mask, there is no occurrence of the following disadvantage: an altered layer is formed in a surface portion of the resist film due to ion introduction, and removal of the resist film therefore takes a lot of time.

Moreover, the present invention relates to a method of manufacturing a thin film transistor substrate, including the steps of: forming patterns of a semiconductor layer for a one conductivity type channel transistor and a semiconductor layer for a opposite conductivity type channel transistor on or above an insulating substrate, forming a gate insulating film on the semiconductor layers, forming a conductive film, which is to be gate electrodes, on the gate insulating film, forming a structure in which a gate insulating film for the one conductivity type channel transistor and the gate electrode for the one conductivity type channel transistor having a narrower width than a width of the gate insulating film for the one conductivity type channel transistor are stacked from bottom to top on the semiconductor layer for the one conductivity type channel transistor, and forming a pattern of a covering film stack in which a gate insulating film and a conductive film are stacked, the covering film stack covering the semiconductor layer for the opposite conductivity type channel transistor, by patterning the conductive film and the gate insulating film, forming a source region and a drain region for the one conductivity type channel transistor by introducing impurities of the one conductivity type into the semiconductor layer for the one conductivity type channel transistor while using at least any one of the gate electrode for the one conductivity type channel transistor and the gate insulating film therefor as a mask, patterning a resist film delimiting a region for forming the gate electrode for the opposite conductivity type channel transistor on the covering film stack and covering the semiconductor layer for the one conductivity type channel transistor and the gate electrode therefore, forming the gate electrode for the opposite conductivity type channel transistor, the gate electrode having a predetermined width equal to or wider than a width of the resist film by etching the covering film stack while using the resist film as a mask, and forming source and drain regions for the opposite conductivity type channel transistor by introducing impurities of the opposite conductivity type into the semiconductor layer for the opposite conductivity type channel transistor while using at least any one of the resist film and the gate electrode for the opposite conductivity type channel transistor as a mask.

For example, the present invention is performed by a method described as follows. Namely, to begin with, a stepwise structure is formed so that a width of a gate electrode for an N channel TFT is narrower than a width of a gate insulating film therefor, and a region for a P channel TFT is covered with a covering film stack. Thereafter, n-type impurities are introduced into a semiconductor layer for the N channel TFT while using at least any one of the gate electrode of the N channel TFT and the gate insulating film thereof as a mask, thus forming a source region for the N channel TFT and a drain region therefor.

Next, a region for the N channel TFT is masked, a resist film for forming a gate electrode for the P channel TFT is patterned, and then a covering film stack is etched, thus forming the gate electrode for the P channel TFT. In this event, a width of the gate electrode is set to a predetermined width equal to or wider than a width of the resist film.

Subsequently, in a state in which the resist film is made to remain, p-type impurities are introduced into a semiconductor layer for the P channel TFT through the gate insulating film while using any one of the resist film and the gate electrode for the P channel TFT as a mask, thus forming the P channel TFT having no LDD structure.

In this way, the number of mask processes can be reduced by one as compared to the prior art (2) without performing counter doping. Moreover, since the P channel TFT is not provided with an LDD structure, a time for introducing impurities can be shortened.

BRIEF DESCRIPTION OF THE DRAWINGS

FIGS. 9A to 9H are cross sectional views showing a method of manufacturing a thin film transistor substrate according to a second embodiment of the present invention.

FIGS. 12A to 12E are cross sectional views showing a method of manufacturing a thin film transistor substrate according to a fifth embodiment of the present invention.

DESCRIPTION OF THE PREFERRED EMBODIMENTS

Hereinafter, description will be made for preferred embodiments of the present invention with reference to the accompanying drawings.

(First Embodiment)

FIGS. 5A to 5F are cross sectional views showing a method of manufacturing a thin film transistor substrate according to a first embodiment of the present invention.

Figure 5A:
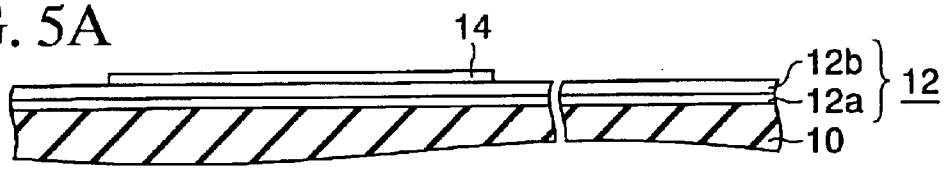
FIGS. 5A to 5F are cross sectional views showing a method of manufacturing a thin film transistor substrate according to a first embodiment of the present invention.

According to the method of manufacturing a thin film transistor substrate of the embodiment, as shown in FIG. 5A, to begin with, a SiN film 12a with a thickness of 50 nm and a $SiO_2$ film 12b with a thickness of 100 nm are sequentially deposited from bottom to top on a transparent insulating substrate 10 made of glass or the like by CVD to form a buffer layer 12.

Thereafter, a polysilicon (p-Si) film with a thickness of 50 nm is deposited on the buffer layer 12, then patterning the p-Si film by photo etching to form an island shaped semiconductor layer 14 (mask process (1)).

Next, a $SiO_2$ film with a thickness of 100 nm to be a gate insulating film is formed on the semiconductor layer 14 and the buffer layer 12 by CVD. Subsequently, an Al film (an aluminum film) and a Mo film (a molybdenum film) are sequentially deposited from bottom to top on the $SiO_2$ film by sputtering.

Figure 5B:
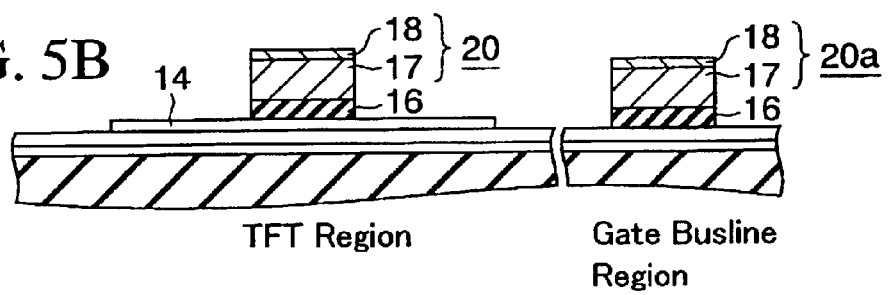

Subsequently, as shown in FIG. 5B, the Mo film, the Al film and the $SiO_2$ film are patterned by photo etching, whereby forming a gate electrode 20 made of the Mo film 18 and the Al film 17 and the gate insulating film 16 (mask process (2)). Simultaneously with the foregoing, a gate busline 20a is formed. The gate busline 20a is used for a interconnection between a gate of an N channel TFT and a gate of a P channel TFT in a peripheral circuit, interconnections between a plurality of TFTs to be mutually connected in parallel in the peripheral circuit, a interconnection between a TFT for a pixel and a TFT in the peripheral circuit, or the like.

Figure 5C:
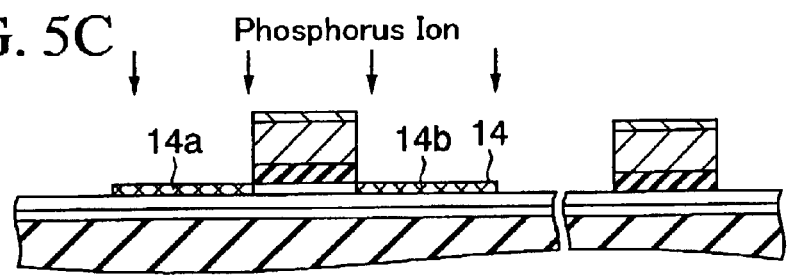

Next, as shown in FIG. 5C, by use of the gate electrode 20 as a mask, P+ ions are implanted into the semiconductor layer 14 to form a source region 14a and a drain region 14b of an N channel TFT.

In a case where a peripheral circuit such as a driver is formed of CMOS circuits, to begin with, $P^+$ ions are implanted into the entire surface of the transparent insulating substrate 10 in order to form N channel TFTs. Thereafter, regions for the N channel TFTs are covered with a resist mask, and then impurities such as $B^+$ ions are selectively implanted into regions for P channel TFTs at a dose two or more times as high as a dose of the $P^+$ ions, thereby making it possible to form the N channel TFTs and the P channel TFTs (mask process (2a)).

Alternatively, the following method may be employed. Reversely to the foregoing, the impurities such as the $B^+$ ions are implanted into the entire surface of the transparent insulating substrate 10 to form the P channel TFTs. Thereafter, the regions for the P channel TFTs are covered with a resist mask, and then the $P^+$ ions are selectively implanted into the regions for the N channel TFTs at a dose two or more times as high as a dose of the $B^+$ ions.

Figure 5D:
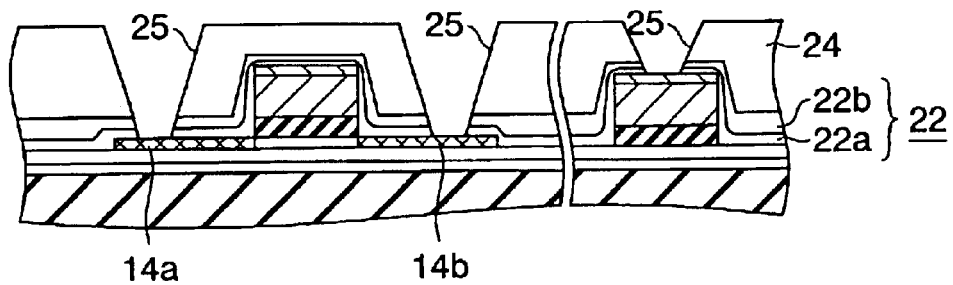

Next, as shown in FIG. 5D, on a structure shown in FIG. 5C, a $SiO_2$ film 22a and a SiN film 22b are sequentially deposited from bottom to top by CVD, thus forming an inorganic interlayer insulating film 22. Since the inorganic interlayer insulating film 22 includes the SiN film 22b, the inorganic interlayer insulating film 22 functions as a blocking film for preventing diffusion of movable ions such as Na ions into the TFT.

Subsequently, after cleaning the transparent insulating substrate 10, a coating film made of positive photosensitive polyimide and the like is applied on the inorganic interlayer insulating film 22. Next, the coating film is dried, exposed, developed, and baked, whereby forming a resin interlayer insulating film 24 with a thickness of 1 to 3 $\mu$m.

Since the resin interlayer insulating film 24 is made of photosensitive resin, an exposed portion thereof dissolves in developer in a case of a positive type, thus making it possible to form a predetermined opening. In this way, the resin interlayer insulating film 24 is formed in a state in which predetermined portions on the source region 14a, the drain region 14b and the gate busline 20a are opened.

In addition, since each of the openings of the resin interlayer insulating film 24 is formed by exposing and developing the positive photosensitive resin, the opening is formed in a gradual forward tapered shape (a shape in which a diameter of the opening increases toward a top of the opening from a bottom thereof).

Next, the inorganic interlayer insulating film 22 bared at the bottom of the opening of the resin interlayer insulating film 24 is etched by use of the resin interlayer insulating film 24 as a mask. Specifically, the SiN film 22b is etched by use of the resin interlayer insulating film 24 as the mask, and then the $SiO_2$ film 22a is etched.

In the embodiment, the inorganic interlayer insulating film 22 is a film stack made of the $SiO_2$ film 22a and the SiN film 22b, from bottom to top. This is because an etching rate ratio to the semiconductor layer 14 when etching the SiN film 22b (an etching rate of the p-Si film/an etching rate of the SiN film) is generally low. Namely, since an etching rate ratio to the semiconductor layer 14 when etching the $SiO_2$ film 22a (an etching rate of the p-Si film/an etching rate of the $SiO_2$ film) is generally high, the $SiO_2$ film 22a is formed directly on the semiconductor layer 14, so that the semiconductor layer 14 is bared due to overetching of the $SiO_2$ film. Note that, in a case of using a condition of a high etching rate ratio (the etching rate of the p-Si film/the etching rate of the SiN film) when the SiN film 22b is etched, a mode in which the $SiO_2$ film 22a is omitted may be adopted.

Moreover, since the SiN film 22b and the $SiO_2$ film 22a are etched by use of the resin interlayer insulating film 24 as the mask, the case is supposed, where the resin interlayer insulating film 24 suffers a decrease in thickness or side etching when being etched. Therefore, it is preferred that the inorganic interlayer insulating film 22 be formed to have a minimum thickness capable of protecting the TFT from the movable ions.

In this way, as shown in FIG. 5D, contact holes 25 in which the source region 14a, the drain region 14b and the gate busline 20a are respectively bared are formed. In this event, since each of the contact holes 25 is formed having the opening in the resin interlayer insulating film 24 as a principal part, the contact hole 25 is formed in a forward tapered shape in which good step coverage of an interconnection is obtained.

Figure 5E:
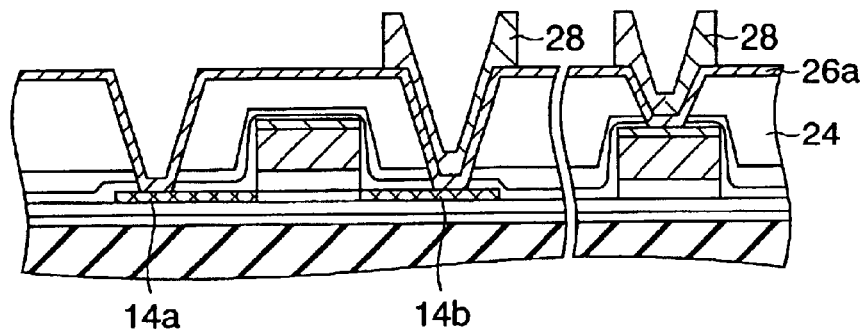

Next, as shown in FIG. 5E, an ITO film 26a is deposited on the resin interlayer insulating film 24 and inner surfaces of the contact holes 25 by sputtering or the like. As an example of conditions for depositing the ITO film 26a, the ITO film 26a can be formed by use of a sputtering system under conditions in which an Ar flow rate is 250 sccm, an $O_2$ flow rate is 0.4 sccm, pressure is 0.8 Pa, DC power is 1 W/cm$^2$, and substrate temperature is 30° C. In this case, the ITO film 26a deposited under the sputtering conditions of the above-described example is deposited on the inner surfaces of the contact holes 25 in a state where the step coverage is good. Note that a $SnO_2$ film may be used instead of the ITO film.

Next, a Ti film, an Al film and a Mo film are sequentially deposited from bottom to top on the ITO film 26a, having thicknesses of 30 nm, 300 nm and 50 nm, respectively, thus forming a metal film made of the Ti film, the Al film and the Mo film.

Next, also as shown in FIG. 5E, a resist film (not shown) is patterned on the metal film, and the metal film is selectively etched with respect to the ITO film 26a by use of the resist film as a mask, thus forming interconnection electrodes 28 (a second conductive film). In this event, the ITO film 26a as an underlayer remains without being etched.

Figure 5F:
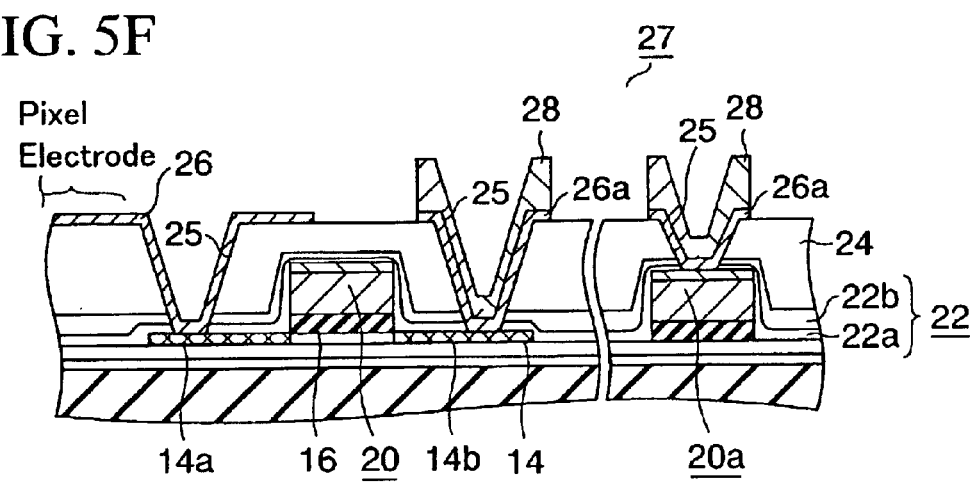

Next, as shown in FIG. 5F, a resist film (not shown) for forming a pixel electrode is patterned, and the ITO film 26a is etched by use of the resist film as a mask, thus forming the pixel electrode 26 connected with the source region 14a. Simultaneously with the foregoing, in a region other than the pixel electrode 26, a part of the ITO film 26a where the interconnection electrodes 28 are not formed is etched with a mask of the interconnection electrodes 28.

In this way, the interconnection electrodes 28 made of the ITO film 26a, the Ti film, the Al film and the Mo film, from bottom to top, are formed on the inner surfaces of the contact holes 25 on the drain 14b and the gate busline 20a. Namely, the drain region 14b of the semiconductor layer 14 is electrically connected to the interconnection electrode 28 (the second conductive film) through the ITO film 26a (a first conductive film). Moreover, a structure in which the gate busline 20a is electrically connected to the interconnection electrode 28 (a fourth conductive film) through the ITO film 26a (a third conductive film) is formed.

Thereafter, heat treatment is carried out, thereby completing the thin film transistor substrate 27 according to the first embodiment of the present invention.

The thin film transistor substrate 27 of the embodiment has a structure in which an electrical interconnection between the drain region 14b and the interconnection electrode 28 as well as an electrical connection between the gate busline 20a and the interconnection electrode 28 are achieved through the ITO film 26a formed together with the pixel electrode 26 in the same process. The ITO film 26a is generally formed in a state in which coverage is better than that of a metal film such as the Mo film or the Al film. Accordingly, by forming the ITO film 26a under the interconnection electrode 28 in advance, the step coverage of the metal film inside the contact hole 25 can be vastly enhanced. Thus, occurrence of a contact failure between the interconnection electrode 28 and either the drain region 14b or the gate busline 20a is prevented.

Moreover, in order to reduce interlayer capacitance formed between the gate electrode 20 and either the interconnection electrode 28 or the pixel electrode 26 and the like, the resin interlayer insulating film 24 with photosensitivity is used as a principal part of an interlayer film. The use of the resin interlayer insulating film 24 enables easy formation of a thick interlayer insulating film by applying coating liquid and drying solvent without using a vacuum equipment. In addition, since a positive or negative photosensitive resin is used, an opening can be formed by development. Accordingly, a special process for etching the thick interlayer insulating film is unnecessary. Namely, a process for forming the resin interlayer insulating film 24 serves also as a conventional resist film forming process for forming the contact hole 25, thereby making it possible to increase productivity. Furthermore, the opening formed by exposing and developing the positive photosensitive resin has the gradual forward tapered shape, which is very convenient from the viewpoint of enhancing the step coverage of the interconnection electrode 28 inside the contact hole 25.

Mask processes according to the method of manufacturing a thin film transistor substrate of the embodiment are five processes including a process for patterning the semiconductor layer 14, a process for patterning the gate electrode 20 (the gate busline 20a), a process for patterning the resin interlayer insulating film 24, a process for patterning the interconnection electrode 28 and a process for patterning the pixel electrode 26. The number of mask processes thereof is reduced by one process as compared with the number of mask processes of the prior art (1) (in a case of forming a CMOS circuit, the number of mask processes is reduced from seven processes to six processes). Moreover, in regard to the processes for depositing films, in the embodiment, since it is not necessary to form the passivation layer 120 of the prior art (1), the number of process is reduced by one process.

Furthermore, in addition to that the number of fabrication processes can be reduced as described above, the use of the resin interlayer insulating film 24 can easily thicken the interlayer insulating film, thereby reducing the interlayer capacitance. Thus, load capacitance and operating speed of the peripheral circuit is improved to enhance display characteristics.

Moreover, the gate electrode 20 and the gate busline 20a have a structure made of the Al film 17 and the Mo film 18, from bottom to top. Accordingly, the Mo film 18 is brought into direct contact with the ITO film 26a to be electrically connected thereto at the bottom of the contact hole 25. In a case where the Al film 17 is brought into direct contact with the ITO film 26a to be electrically connected thereto, a contact failure is apt to occur owing to an oxidation-reduction reaction between the Al film 17 and the ITO film 26a. Therefore, in the embodiment, the gate electrode 20 and the gate busline 20a are formed as film stacks, each being made of the Al film 17 and the Mo film 18.

Alternatively, the gate electrode 20 may be formed of only a metal film which has no oxidation-reduction reaction with the ITO film 26a without using the Al film 17, as far as the gate electrode 20 has a predetermined resistance value. As the metal which has no oxidation-reduction reaction with the ITO film 26a, refractory metal such as Ti, Cr, Ta or W, or an alloy thereof may be used besides the above-described Mo. Moreover, in a case where the Al film 17 is used, an Al alloy film such as an Al—Si film or an Al—Nd film may be used instead of the Al film 17.

Figure 6:
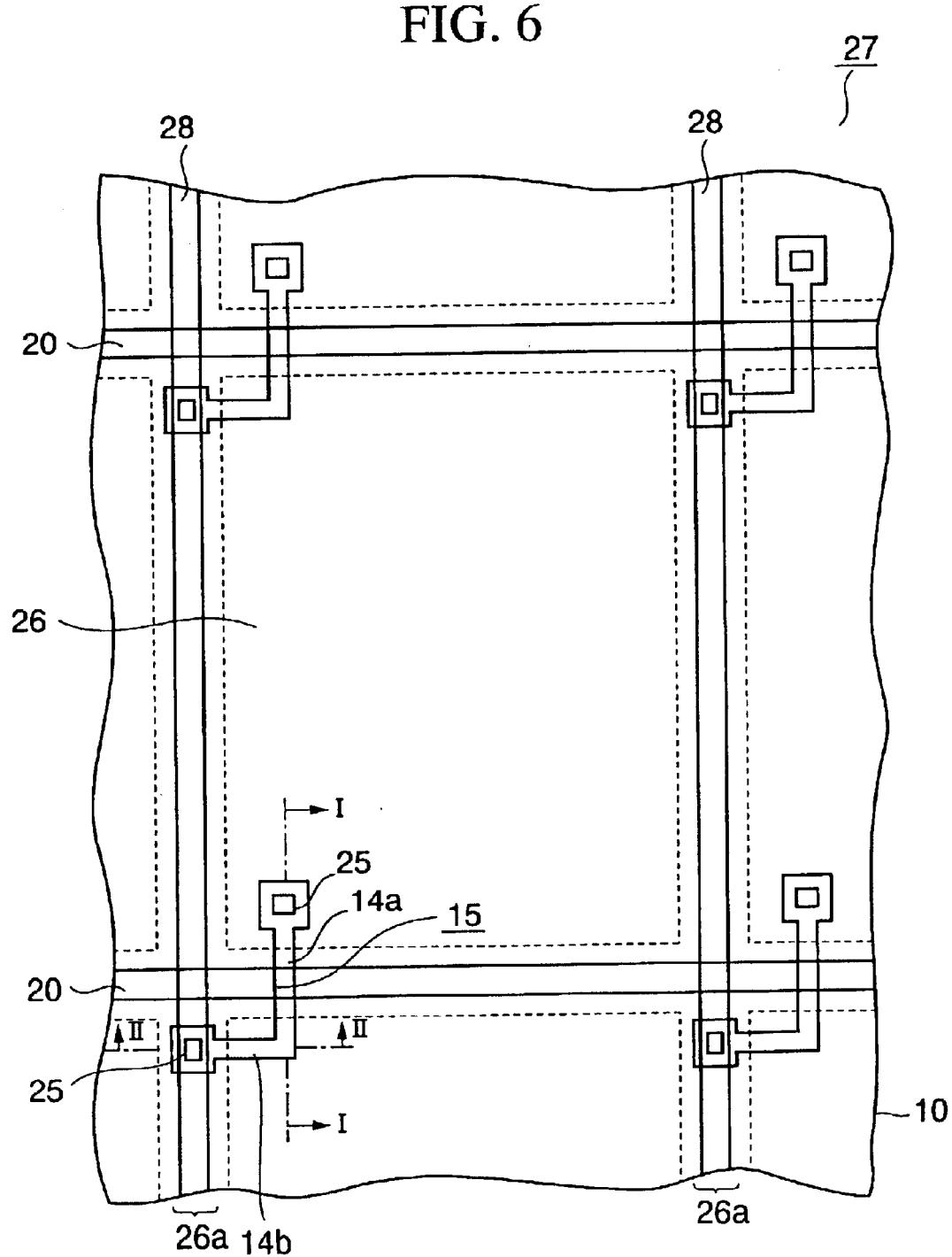
FIG. 6 is a plan view showing a thin film transistor substrate according to the first embodiment.
Figure 7A:
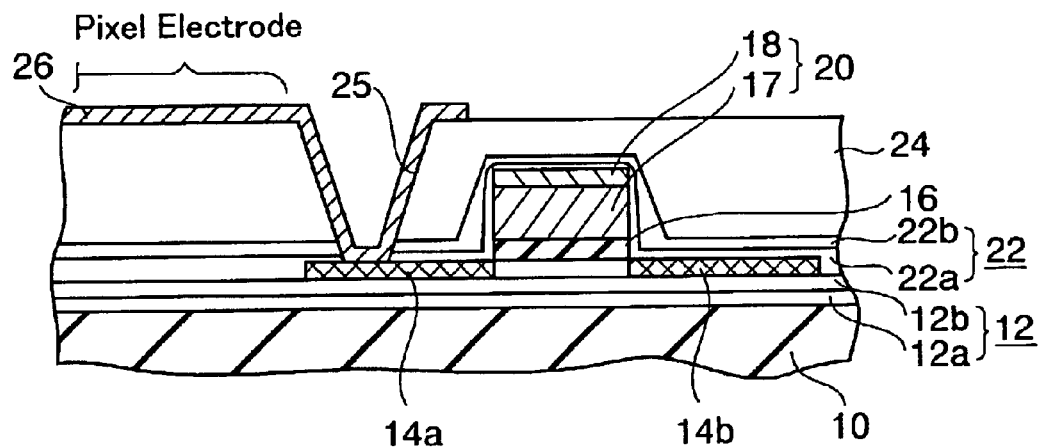
FIG. 7A is a cross sectional view taken along a line I—I of FIG. 6.
Figure 7B:
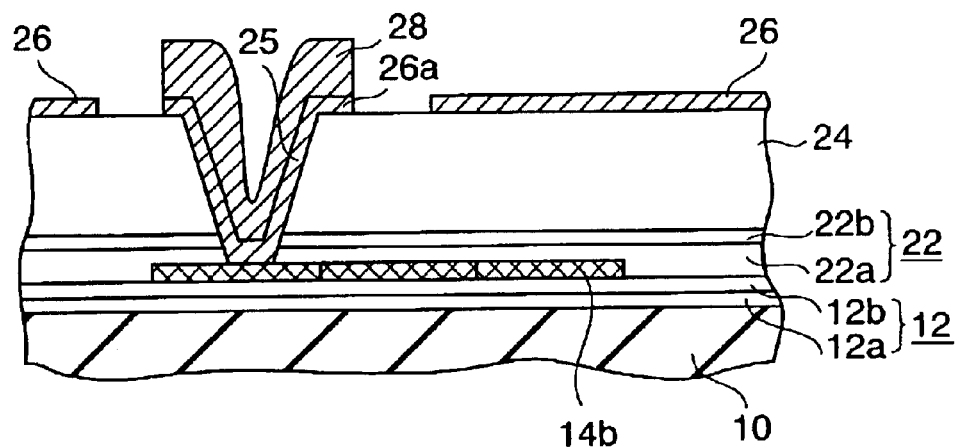
FIG. 7B is a cross sectional view taken along a line II—II of FIG. 6.

FIG. 6 is a plan view showing the thin film transistor substrate of the embodiment. FIG. 7A is a cross sectional view taken along a line I—I of FIG. 6, and FIG. 7B is a cross sectional view taken along a line II—II of FIG. 6.

In the thin film transistor substrate 27 of the embodiment, as shown in FIG. 6, a plurality of gate bus lines 20 extending in a horizontal direction and a plurality of data bus lines 28 extending in a vertical direction are provided on the transparent insulating substrate 10, and these gate and data bus lines delimit pixel regions. In each of the pixel regions, a pixel electrode 26 made of a transparent ITO (Indium Tin Oxide) film is formed. The gate bus lines 20 are connected to a gate driver circuit (not shown) in peripheral circuits integrally formed on the transparent insulating substrate 10, and the data bus lines 28 are connected to a data driver circuit (not shown), which is also in the peripheral circuits.

The polysilicon TFT element 15 is provided at a lower left portion of the pixel region. The drain region 14b of the polysilicon TFT element 15 is connected to the data bus line 28 through the contact hole 25 formed in the inorganic interlayer insulating film 22 and the resin interlayer insulating film 24. In addition, since the ITO film 26a formed of the same layer as that of the pixel electrode 26 is formed under the entire data bus line 28, the drain region 14b is connected to the data bus line 28 through the ITO film 26a.

Furthermore, a source region 14a of the polysilicon TFT element 15 is connected to the pixel electrode 26 through a contact hole 25 formed in the inorganic interlayer insulating film 22 and the resin interlayer insulating film 24. Note that, in FIG. 6, one of the pixel regions on the thin film transistor substrate is illustrated, and three pixel regions, which include a red (R) pixel, a green (G) pixel and a blue (B) pixel, constitute a pixel unit as a unit of display.

In a cross section structure of the polysilicon TFT element 15, as shown in FIG. 7A, a buffer layer 12 made of a SiN film 12a and a $SiO_2$ film 12b is formed on a transparent insulating substrate 10, and a semiconductor layer 14 is formed thereon. In addition, a gate electrode 20 made of an Al film 17 and a Mo film 18 is formed on the semiconductor layer 14 interposing a gate insulating film therebetween. The gate electrode 20 is covered with an inorganic interlayer insulating film 22 made of a $SiO_2$ film 22a and a SiN film 22b and with a resin interlayer insulating film 24.

A contact hole 25 is formed in the inorganic interlayer insulating film 22 and the resin interlayer insulating film 24 on a source region 14a of the semiconductor layer 14, and, via the contact hole 25, the source region 14a are electrically connected to a pixel electrode 26.

Moreover, in a cross section structure of a drain region 14b of the polysilicon TFT element 15, as shown in FIG. 7B, a contact hole 25 is formed in the inorganic interlayer insulating film 22 and the resin interlayer insulating film 24 on the drain region 14b of the semiconductor layer 14, and, via the contact hole 25, the drain region 14b are electrically connected to a data bus line interposing an ITO film 26a therebetween.

The ITO film can be generally formed in a state where the step coverage is better than that of Ti, Al or Mo, which are materials of the data bus line 28. Accordingly, the drain region 14b bared at the bottom of the contact hole 25 is electrically connected to the ITO film 26a formed in the state where the step coverage is good, and the ITO film 26a is electrically connected to the data bus line 28.

Thus, even in a case where an aspect ratio of the contact hole 25 is increased by thickening the inorganic interlayer insulating film 22 and the resin interlayer insulating film 24 in order to reduce interlayer capacitance, a contact failure between the drain region 14b and the data bus line 28 is prevented.

Figure 8:
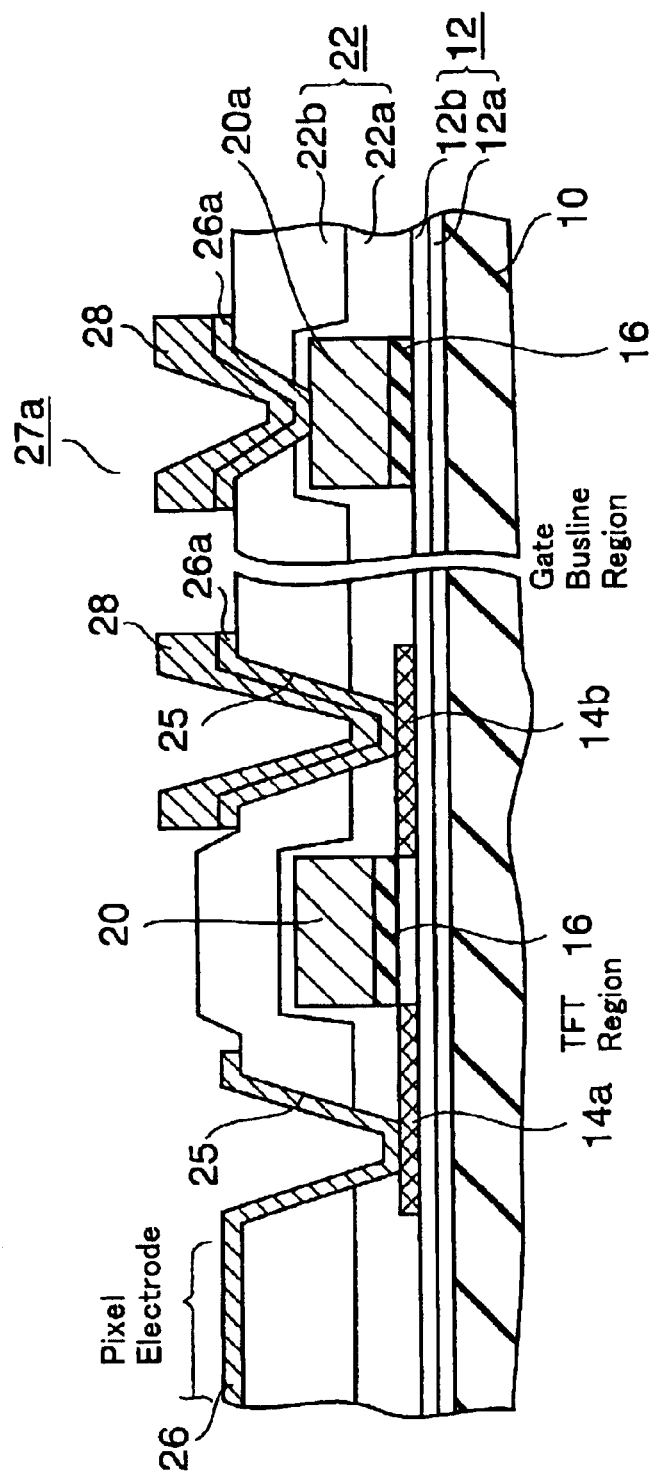
FIG. 8 is a cross sectional view showing a modification of the thin film transistor substrate according to the first embodiment.

FIG. 8 is a cross sectional view showing a modification of the thin film transistor substrate of the first embodiment. In the modification of the thin film transistor substrate of the first embodiment, as shown in FIG. 8, a buffer layer 12 made of a SiN film 12a and a $SiO_2$ film 12b is formed on a transparent insulating substrate 10. In a TFT region, a semiconductor layer 14 is formed on the buffer layer 12, and a gate electrode 20 is formed on the semiconductor layer 14 interposing a gate insulating film 16 therebetween. Furthermore, in a gate busline region, a gate busline 20a is formed on the buffer layer 12 interposing the gate insulating film 16 therebetween.

In addition, the gate electrode 20 and the gate busline 20a are covered with an inorganic interlayer insulating film 22 made of a $SiO_2$ film 22a with a thickness of 690 nm, for example, and a SiN film 22b with a thickness of 200 nm, for example.

A contact hole 25 is formed in the inorganic interlayer insulating film 22 on a source region 14a of the semiconductor layer 14, and the source region 14a is electrically connected to a pixel electrode 26 through the contact hole 25. Moreover, a contact hole 25 is formed in the inorganic interlayer insulating film 22 on a drain region 14b, and the drain region 14b is electrically connected to a data bus line (a interconnection electrode) 28 through an ITO film 26a which is formed of the same layer as that of the pixel electrode 26.

Furthermore, in the gate busline region, a contact hole 25 is formed in the inorganic interlayer insulating film 22 on the gate busline 20a, and the gate busline 20a is electrically connected to the interconnection electrode 28 through the ITO film 26a which is formed of the same layer as that of the pixel electrode 26.

Thus, interlayer capacitance may be reduced by thickening the inorganic interlayer insulating film 22 made of the $SiO_2$ film and the SiN film without forming the above-described resin interlayer insulating film 24.

For example, interlayer capacitance relating to the inorganic interlayer insulating film 22 made of the $SiO_2$ film 22a with a thickness of 690 nm and the SiN film with a thickness of 200 nm is reduced to almost half of interlayer capacitance relating to an inorganic interlayer insulating film made of a $SiO_2$ film with a thickness of 400 nm. Moreover, the inorganic interlayer insulating film 22 includes the SiN film 22b, thereby making it possible to prevent movable ions and the like from diffusing into the TFT.

Aspect ratios of the contact holes 25 are enlarged due to thickening the inorganic interlayer insulating film 22. However, as described above, the ITO film 26a is formed under the data bus line (the interconnection electrode) 28 inside the contact hole 25, thereby improving step coverage of the data bus line (the interconnection electrode) 28 inside the contact hole 25 to prevent occurrence of a contact failure.

(Second Embodiment)

FIGS. 9A to 9H are cross sectional views showing a method of manufacturing a thin film transistor substrate according to a second embodiment of the present invention. The second embodiment is different from the first embodiment in that interconnection electrodes and a pixel electrode are patterned in one mask process and a LDD structure is formed without an increase in the number of mask processes as compared to the first embodiment. Note that detailed description for the same processes as those of the first embodiment will be omitted.

Figure 9A:
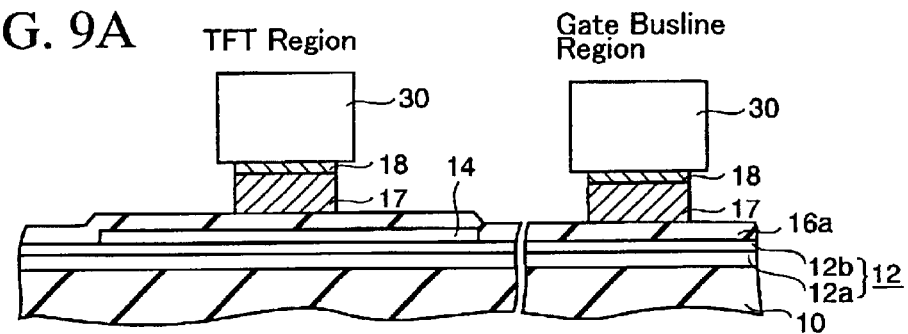

First, description will be made for processes until obtaining a cross section structure of FIG. 9A. As shown in FIG. 9A, by a method similar to the first embodiment, a buffer layer 12 made of a SiN film 12a and a $SiO_2$ film 12b is formed on a transparent insulating substrate 10 by CVD. Thereafter, a polysilicon (p-Si) film is formed on the buffer layer 12, and the p-Si film is patterned by photo etching to form an island shaped semiconductor layer 14 (mask process (1)).

Next, a $SiO_2$ film 16a with a thickness of 100 nm, which is to be a gate insulating film, is formed on the semiconductor layer 14 and the buffer layer 12 by CVD. Subsequently, an Al film (an aluminum film) and a Mo film (a molybdenum film) are sequentially formed from bottom to top on the $SiO_2$ film 16a by sputtering.

Next, a resist film 30 is patterned on the Mo film, and the Mo film and the Al film are etched by use of the resist film 30 as a mask. In this case, the etching is performed so that patterns of the Mo film 18 and the Al film 17 become narrower than the pattern of the resist film 30 due to side etching by 0.3 to 2 $\mu$m, preferably about 1 $\mu$m, for each side.

Figure 9B:
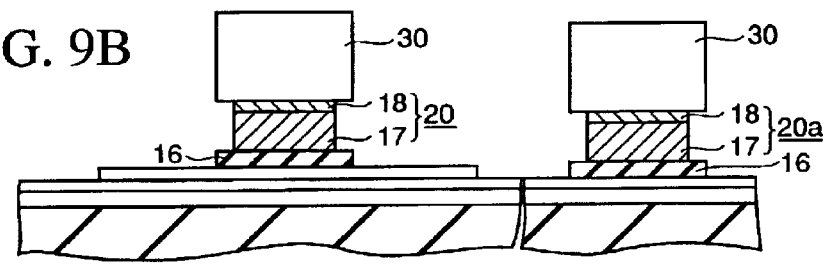

Next, as shown in FIG. 9B, the $SiO_2$ film 16a is anisotropically etched by use of the resist film 30 as a mask similarly to the foregoing, thereby forming a gate insulating film 16. At this time, the gate insulating film 16 is formed into substantially the same pattern as the pattern of the resist film (mask process (2)).

Thus, the gate electrode 20 made of the Mo film 18 and the Al film 17 and the gate insulating film 16 with a width wider than a width of the gate electrode 20 by about 1 $\mu$m for each side are formed to obtain a so-called stepwise shape. Simultaneously with the foregoing, a gate busline 20a is formed.

Figure 9C:
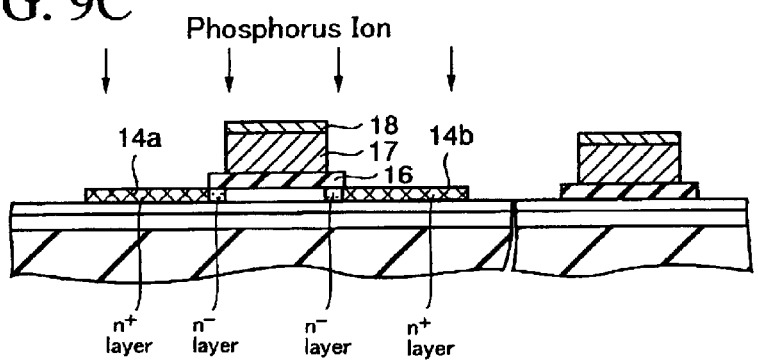

Next, as shown in FIG. 9C, after removing the resist film 30, P+ ions are implanted into the semiconductor layer 14 at low accelerating energy with high concentration by use of the gate electrode 20 and the gate insulating film 16 as a mask, thereby forming high concentration impurity regions (n+ layer) in the semiconductor layer 14 which is outside both side surfaces of the gate insulating film 16.

Subsequently, P+ ions are implanted into the semiconductor layer 14 at high accelerating energy with low concentration through the gate insulating film 16 by use of the gate electrode 20 as a mask, thereby forming low concentration impurity regions (n− layer) in the semiconductor layer 14 which is outside both side surfaces of the gate electrode 20 and directly under the gate insulating film 16. In this way, a source region 14a and a drain region 14b of an N channel TFT are formed, and, in addition, there is formed an LDD structure of the N channel TFT in which the n− layer is formed between a channel and the drain region 14b.

In a case where a peripheral circuit such as a driver is formed by CMOS circuits, to begin with, P+ ions are implanted into the entire surface of the transparent insulating substrate 10 in order to form N channel TFTs (including the TFT for a pixel), though illustration thereof is not made in particular. Subsequently, the N channel TFTs are masked with a resist film, and B+ ions are selectively implanted only into regions for P channel TFTs at a dose two or more times as high as a dose of the above described P+ ions (mask process (2a)). Thus, n type is reversed to form a p+ layer and a p− layer, thereby forming LDD structures of the P channel TFTs.

By using the foregoing method, LDD structures can be made without an increase in the number of mask processes compared to the first embodiment.

Figure 9D:
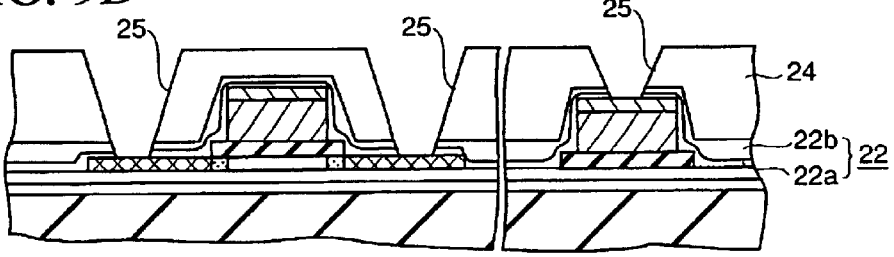

Next, with a method similar to the first embodiment, as shown in FIG. 9D, an inorganic interlayer insulating film 22 made of a $SiO_2$ film 22a and a SiN film 22b is formed, and a resin interlayer insulating film 24 having openings at predetermined regions is formed on the inorganic interlayer insulating film 22 (mask process (3)). Subsequently, by use of the resin interlayer insulating film 24 as a mask, the inorganic interlayer insulating film 22 is etched to form contact holes 25.

Next, as shown in FIG. 9E, an ITO film 26a with a thickness of 100 nm is formed on the resin interlayer insulating film 24 and inner surfaces of the contact holes 25 under conditions similar to the deposition conditions of the first embodiment. Subsequently, a Ti film (thickness: 30 nm), an Al film (thickness: 300 nm) and a Mo film (thickness: 50 nm) are sequentially formed from bottom to top on the ITO film 26a to form a metal wiring film 28a.

Subsequently, as shown in FIG. 9E similarly to the foregoing, a photomask 38 relating to photo lithography for forming interconnection electrodes and a pixel electrode is prepared. In the photomask 38, light shielding film patterns 36b which do not transmit light at all are formed on portions corresponding to the interconnection electrodes to be formed, and a light shielding pattern 36a having a light transmittance of 10 to 60% is formed on a portion corresponding to the pixel electrode to be formed. In addition to this, portions corresponding to where both the interconnection electrodes and the pixel electrode are not formed are not provided with a light shielding film, and the portions therefore have a light transmittance of about 100%. As the light shielding film, a Cr film, a Ti film and the like can be used.

In order to set the light transmittance of the light shielding film pattern 36a in a range from 10 to 60%, as shown in FIG. 9E, the photomask 38 may be manufactured so that the light shielding film pattern 36a on the portion corresponding to the pixel electrode has a thickness thinner than a thickness of the light shielding patterns 36b on the portions corresponding to the interconnection electrodes by a predetermined thickness. Alternatively, a photomask having the following characteristics may be used: the light shielding film pattern 36a has a sufficient thickness so as not to transmit light at all, and openings are formed in the light shielding film pattern 36a at a predetermined aperture ratio.

Alternatively, a first photomask in which light shielding film patterns not transmitting light are formed only on portions corresponding to the interconnection electrodes and a second photomask in which light shielding patterns not transmitting light are severally formed on portions corresponding to the interconnection electrodes and the pixel electrode are prepared. Then, the exposure amount of a resist film for forming the pixel electrode may be adjusted by performing exposure two times by use of the first photomask and the second photomask, respectively.

By photo lithography using the above-described photomasks, as shown in FIG. 9E similarly to the foregoing, resist films 30 having a resist film 30a for the pixel electrode and resist films 30b for the interconnection electrodes are patterned so that a thickness of a pixel electrode portion is set to be about half of a thickness of interconnection electrode portions (mask process (4)).

Next, as shown in FIG. 9F, the metal wiring film 28a and the ITO film 26a are etched by use of the resist films 30 as a mask.

Subsequently, as shown in FIG. 9G, controlled ashing is performed by oxygen plasma until the resist film pattern 30a for the pixel electrode is removed to disappear. At this time, the metal wiring film 28a under the resist film 30a for the pixel electrode is bared. At this time, the resist films 30b for the interconnection electrodes are thinned but are left with a predetermined thickness.

Next, in a state of a structure of FIG. 9G, the bared metal wiring film 28a are selectively etched with respect to the ITO film 26a as an underlayer to bare the ITO film 26a, and then the resist films 30b for forming the interconnection electrodes are removed. In this way, as shown in FIG. 9H, the interconnection electrodes 28 and the pixel electrode 26 are formed by one mask process.

As described above, the thin film transistor substrate 27b manufactured by the method of manufacturing a thin film transistor substrate according to the second embodiment is completed.

In the method of manufacturing a thin film transistor substrate of this embodiment, the number of mask processes is four in a case of manufacturing N channel TFTs, and the number of mask processes is five in a case of manufacturing CMOS circuits. Thus, the number of mask processes is reduced as compared to the first embodiment. In addition, the method of the second embodiment includes a process of forming an LDD structure.

Meanwhile, in a case where CMOS circuits are manufactured by one mask process to form LDD structures in the prior art, the number of mask processes is eight in total. Accordingly, the number of processes is vastly reduced by using the method of manufacturing a thin film transistor substrate of the embodiment.

In this embodiment, the manufacturing method, which uses both of the method of forming the LDD structure without an increase in the number of mask processes as compared to the first embodiment and the method of forming the pixel electrode and the interconnection electrodes in one mask process was described as an example. However, the thin film transistor substrate may be manufactured by using only one of the methods.

(Third Embodiment)

FIGS. 10A to 10J are cross sectional views showing a method of manufacturing a thin film transistor substrate according to a third embodiment of the present invention.

In the third embodiment, in forming CMOS TFTs by counter doping, impurity ion implantation is performed without using a resist film as a mask, thereby facilitating removal of the resist film to enhance productivity.

Figure 10A:
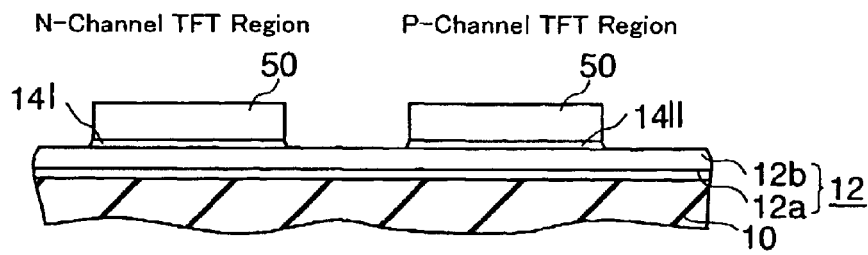
FIGS. 10A to 10J are cross sectional views showing a method of manufacturing a thin film transistor substrate according to a third embodiment of the present invention.

In the method of manufacturing a thin film transistor substrate of the embodiment, as shown in FIG. 10A, a SiN film 12a with a thickness of 50 nm and a SiO₂ film 12b with a thickness of 200 nm are formed on a transparent insulating substrate 10 by plasma CVD to form a buffer layer 12. Subsequently, an amorphous film (an a-Si film) with a thickness of 50 nm is formed on the buffer layer 12 by plasma CVD, thereafter laser crystallization by an excimer laser is carried out to convert the a-Si film into a p-Si film.

Subsequently, a resist film 50 is patterned on the p-Si film, and then the p-Si film is etched into island shapes by use of the resist film 50 as a mask, thus forming a semiconductor layer 14I for an N channel TFT and a semiconductor layer 14II for a P channel TFT. Note that the N channel TFT corresponds to a TFT for a pixel or an N channel TFT in a CMOS peripheral circuit, and the P channel TFT corresponds to a P channel TFT in a CMOS peripheral circuit.

Next, after removing the resist film 50, a gate insulating film and a first conductive film are sequentially formed from bottom to top on the semiconductor layers 14I and 14II and the buffer layer 12. For example, a SiO₂ film with a thickness of 100 nm is formed as the gate insulating film by plasma CVD, and an Al—Nd film with a thickness of 300 nm is formed as the first conductive film by sputtering.

Figure 10B:
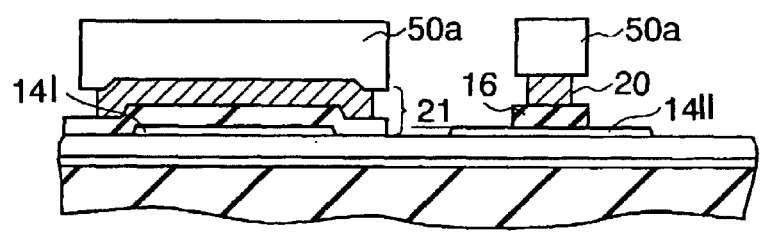

Subsequently, as shown in FIG. 10B, a resist film 50a is patterned on the Al—Nd film, and then the Al—Nd film is etched by wet etching using Al etchant while using the resist film 50a as a mask. Further, the SiO₂ film is etched by dry etching using fluorinated gas. Thus, a gate electrode 20 and a gate insulating film 16, which are composed of Al—Nd film patterns, are formed in a region for the P channel TFT. At this time, the gate electrode 20 is formed so as to be narrowed by a predetermined width from both edges of the resist film 50a due to side etching. Meanwhile, the gate insulating film 16 is formed to substantially the same width as that of the resist film 50a. Thus a so-called stepwise shape is obtained.

On the other hand, in a region for the N channel TFT, simultaneously with the foregoing, a covering film stack 21 made of the Al—Nd film and the SiO₂ film is patterned so that a principal part of the region is covered.

Figure 10C:

Next, as shown in FIG. 10C, after removing the resist film 50a, B+ ions are implanted into the entire surface of the transparent insulating substrate 10, and thereby implanted into the semiconductor layer 14II for the P channel TFT. For example, B+ ions are implanted into the semiconductor layer 14II for the P channel TFT by use of the gate electrode 20 and the gate insulating film 16 as a mask under conditions that accelerating energy is 10 keV and a dose is $2 \times 10^{15}$ atoms/cm². Furthermore, B+ions are implanted into the semiconductor layer 14II through portions of the gate insulating film 16 which are outside the both edges of the gate electrode 20 by use of the gate electrode 20 as a mask under conditions that accelerating energy is 70 keV and a dose is $2 \times 10^{14}$ atoms/cm². At this time, the dose of B+ ions is set to be about twice as high as a dose of P+ ions used for forming the N channel TFT later.

In the above described manner, a source region 14a and a drain region 14b of the P channel TFT are formed, and an LDD structure thereof is also formed. Note that, since the semiconductor layer 14I for the N channel TFT is covered with the covering film stack 21, B+ ions are not implanted into the semiconductor layer 14I.

Figure 10D:
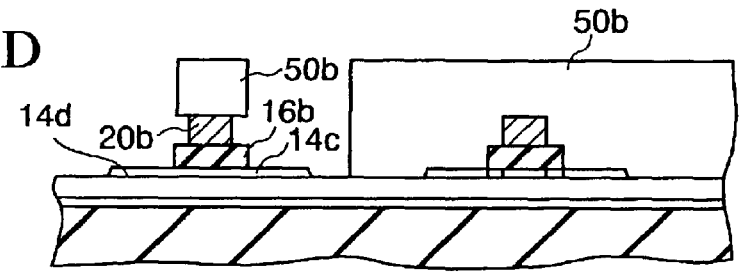

Next, as shown in FIG. 10D, on a structure of FIG. 10C, a resist film 50b for covering the region for the P channel TFT and for forming a gate electrode of the N channel TFT is formed. Subsequently, by a method similar to the above-described method of forming the gate electrode 20 and the gate insulating film 16 of the P channel TFT, the covering film stack 21 made of the Al—Nd film and the SiO₂ film is etched by use of the resist film 50a as a mask, thus forming the gate electrode 20b and a gate insulating film 16b for the N channel TFT.

At this time, similarly to the case where the gate electrode 20 of the P channel TFT is formed, the gate electrode 20b is formed so as to be narrowed due to side etching from both edges of the resist film 50b, and the gate insulating film 16b is formed to substantially the same width as that of the resist film 50b.

Figure 10E:
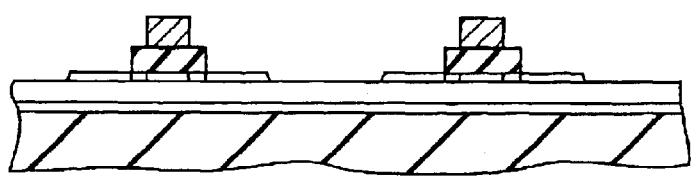

Next, as shown in FIG. 10E, after removing the resist film 50b, P+ ions are implanted into the entire surface of the transparent insulating substrate 10. For example, P+ ions are implanted into the semiconductor layer 14I for the N channel TFT by use of the gate electrodes 20 and 20b and the gate insulating films 16 and 16b as a mask under conditions that accelerating energy is 10 keV and a dose is $1 \times 10^{15}$ atoms/cm². Furthermore, P+ ions are implanted into the semiconductor layer 14I for the N channel TFT through portions of the gate insulating film 16 and 16b which are outside the both edges of the gate electrodes 20 and 20b by use of the gate electrodes 20 and 20b as a mask under conditions that accelerating energy is 70 keV and a dose is $5 \times 10^{13}$ atoms/cm².

In the above described manner, a source region 14c and a drain region 14d of the N channel TFT are formed, and an LDD structure thereof is also formed. Note that, though P+ ions are implanted also into the semiconductor layer 14II for the P channel TFT, B+ ions have been already implanted into the semiconductor layer 14II for the P channel TFT at the dose about twice as high as the dose of P+ ions. Accordingly, a conductivity type of the semiconductor layer 14II remains to be p-type without being converted into n-type.

Thus, CMOS TFTs having a LDD structure is formed without implanting ions by use of a resist film as a mask.

Figure 10F:
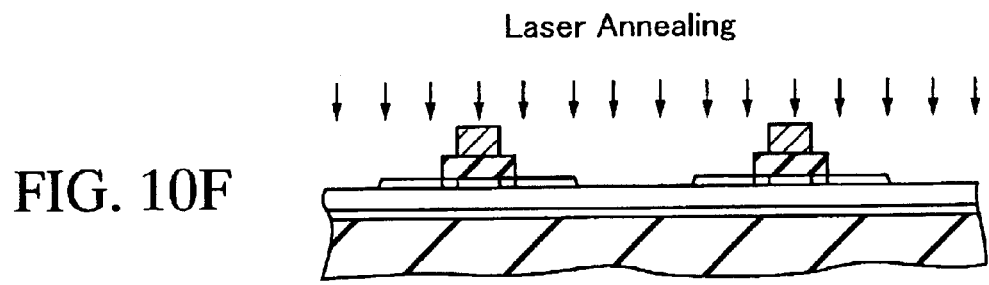

Thereafter, as shown in FIG. 10F, excimer laser is irradiated onto a structure of FIG. 10E, thus activating the P+ ions and the B+ions.

Figure 10G:
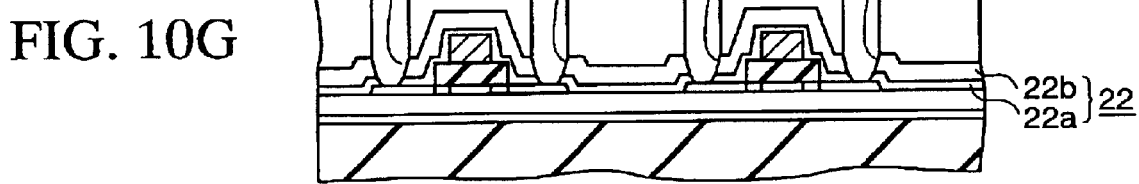

Next, as shown in FIG. 10G, a SiO₂ film 22a with a thickness of 60 nm and a SiN film 22b with a thickness of 370 nm are sequentially formed from bottom to top on a structure of FIG. 10F by plasma CVD, thus forming a first interlayer insulating film 22. Subsequently, a resist film 50c is patterned on the first interlayer insulating film 22, and then the first interlayer insulating film 22 is etched by dry etching using fluorinated gas while using the resist film 50c as a mask, thus forming first contact holes 23.

Next, after removing the resist film 50c, a second conductive film is formed on the first interlayer insulating film 22 and inner surfaces of the contact holes 23. The second conductive film may be formed by sequentially forming a first Ti film, an Al film and a second Ti film having thicknesses of 100 nm, 200 nm and 100 nm, respectively, from bottom to top by sputtering.

Figure 10H:
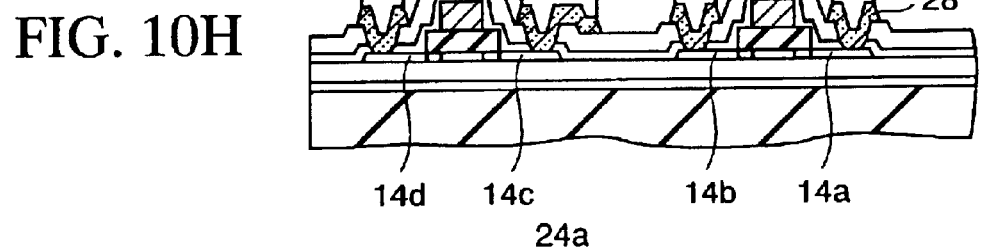
Figure 10I:
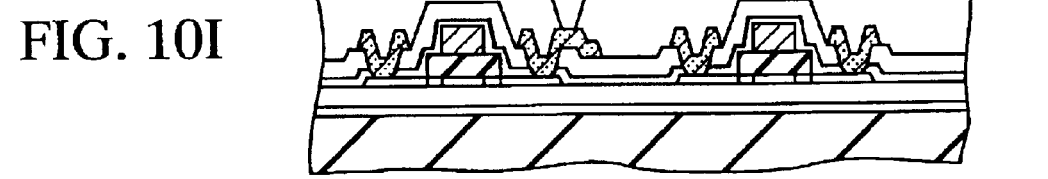

Next, as shown in FIG. 10H, a resist film 50d is patterned on the second conductive film, and then the second conductive film is etched by dry etching using chlorinated gas while using the resist film 50d as a mask. Thus, interconnection electrodes 28 electrically connected to the source regions 14a and 14c and the drain regions 14b and 14d are formed.

Subsequently, as shown in FIG. 10, after removing the resist film 50d, transparent photosensitive resin such as photosensitive polyimide is applied, and then exposure and development are performed. Thus a photosensitive resin interlayer insulating film 24 having second contact holes 24a is formed on the source region 14c of the N channel TFT.

Figure 10J:
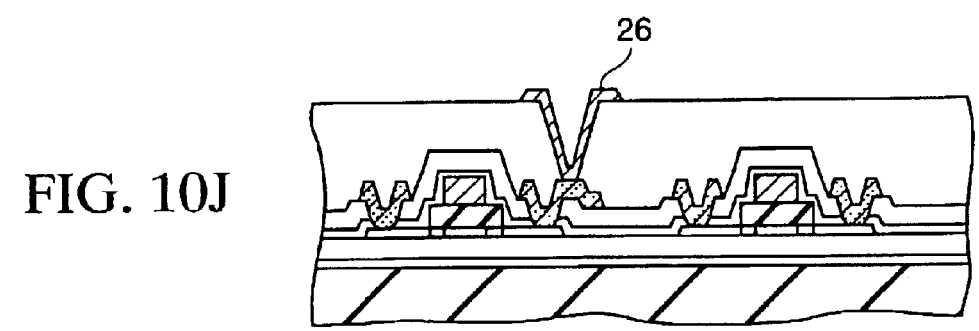

Next, a third conductive film is formed on the resin interlayer insulating film 24 and inner surfaces of the contact holes 24a. As the third conductive film, an ITO film with a thickness of 70 nm is formed by sputtering. Subsequently, as shown in FIG. 10J, the ITO film is patterned by photo etching to form a transparent pixel electrode 26.

As explained above, in the method of manufacturing a thin film transistor substrate according to the third embodiment, to begin with, B+ions are implanted into the entire surface of the resultant structure in FIG. 10C by use of a stepwise structure composed of the gate electrode 20 and the gate insulating film 16 as a mask while masking the region for the N channel TFT with the covering film stack 21, thus forming the P channel TFT having the LDD structure. At this time, the dose of B+ions is set to be about twice as high as the dose of P+ions for forming the N channel TFT.

Subsequently, P+ ions are implanted into the entire surface of the resultant structure in FIG. 10E by use of the stepwise structure composed of the gate electrode 20b and the gate insulating film 16b of the N channel TFT as a mask, thus forming the N channel TFT.

The above-described method eliminates the process of implanting impurities by use of a resist film as a mask in an impurity implantation process relating to fabrication of CMOS TFTs. Accordingly, there is no occurrence of the following disadvantage: an altered layer is formed in a surface portion of the resist film due to ion implantation, and removal of the resist film therefore takes a lot of time.

Moreover, although fabrication process of CMOS TFTs having LDD structures according to the prior art (2) requires eight mask processes, in this embodiment, CMOS TFTs can be manufactured with seven mask processes. Accordingly, production efficiency can be increased.

(Fourth Embodiment)

FIGS. 11A to 11J are cross sectional views showing a method of manufacturing a thin film transistor substrate according to a fourth embodiment. The fourth embodiment is different from the third embodiment in that, in forming a P channel TFT, a SiO$_2$ film under a gate electrode is not etched but is used as a gate insulating film and an LDD structure is not formed for the P channel TFT. For the same processes as those of the third embodiment, detailed explanation will be omitted.

Figure 11A:
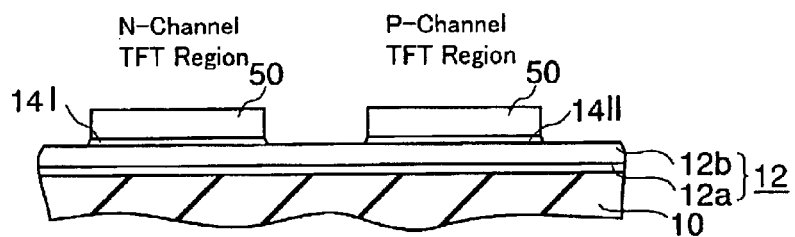
FIGS. 11A to 11J are cross sectional views showing a method of manufacturing a thin film transistor substrate according to a fourth embodiment of the present invention.

In the method of manufacturing a thin film transistor substrate of the fourth embodiment, as shown in FIG. 11A, the same structure as that of FIG. 10A is obtained by a method similar to the third embodiment.

Figure 11B:
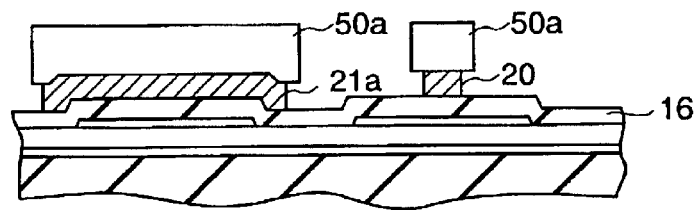
Figure 11C:
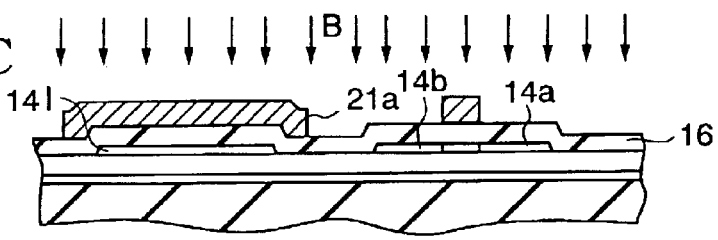
Figure 11D:
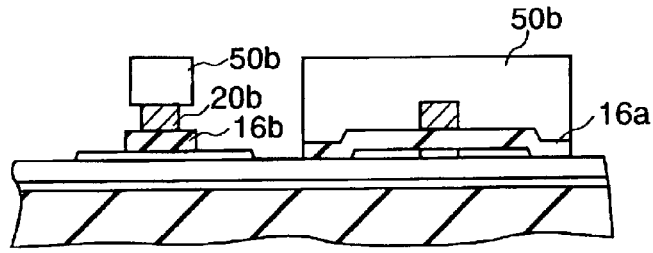
Figure 11E:
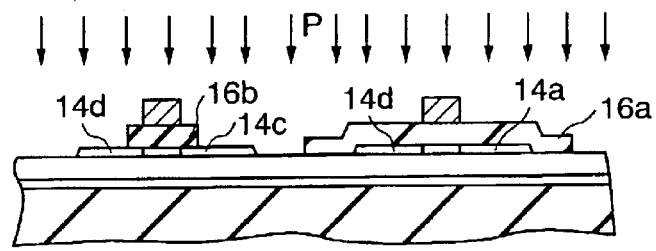

Next, as shown in FIG. 11B, by a method similar to the third embodiment, a SiO$_2$ film 16, which is to be a gate insulating film, and an Al—Nd layer are formed, and a resist film 50a is patterned on the Al—Nd layer. The Al—Nd layer is etched by use of the resist film as a mask, thereby forming a gate electrode 20 of a P channel TFT, which is narrowed due to side etching from both edges of the resist film. At this time, a covering Al—Nd film 21a for covering a semiconductor layer 14I for an N channel TFT is formed in a region for the N channel TFT.

Figure 1A:
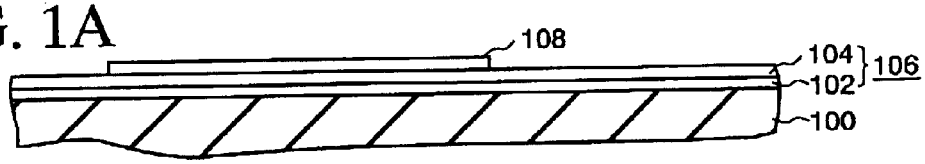
FIGS. 1A to 1E are cross sectional views showing a method of manufacturing a polysilicon TFT substrate according to a prior art (1).
Figure 1B:
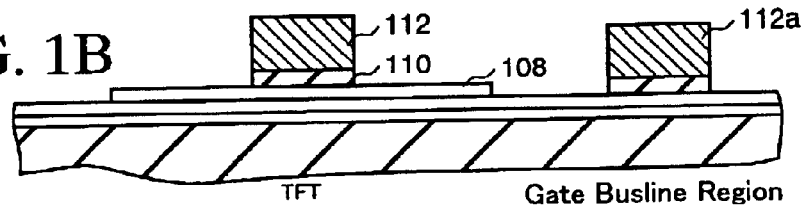
Figure 1C:
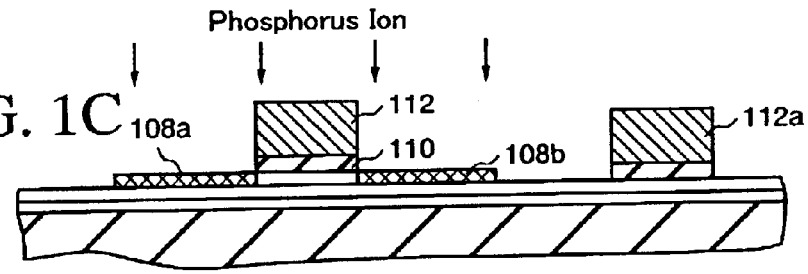

Next, as shown in FIG. 1C, B+ions are implanted into the entire surface of the transparent insulating substrate 10. By the ion implantation, in a region for the P channel TFT, a p+ layer is formed in a semiconductor layer 14II for the P channel TFT through the SiO$_2$ film by use of the gate electrode 20 as a mask, thus forming a source region 14a and a drain region 14b. Note that, in a similar manner to the third embodiment, a dose of B+ ions is set to be about twice as high as a dose of P+ ions to be implanted later.

Meanwhile, in the region for the N channel TFT, since the covering Al—Nd film 21a serves as a mask, B+ ions are hardly implanted into the semiconductor layer 14I for the N channel TFT.

Figure 1D:
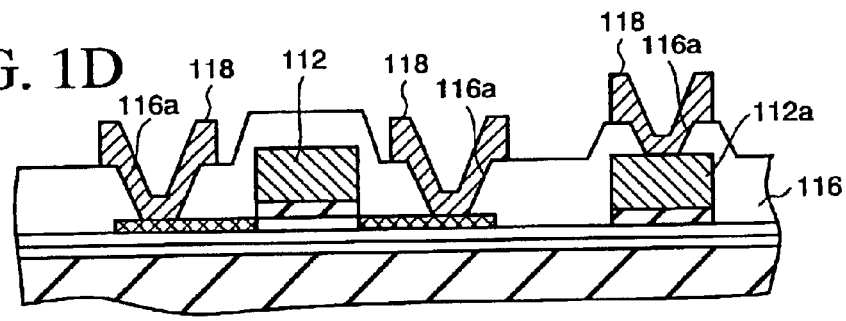

Next, as shown in FIG. 1D, a resist film 50b is patterned in order to cover a principal part of the region for the P channel TFT and form a gate electrode of the N channel TFT. Subsequently, the covering Al—Nd film 21a and the SiO$_2$ film 16 are etched by use of the resist film 50b as a mask. At this time, the gate electrode 20b is formed so as to be narrowed due to side etching from both edges of the resist film 50b, and the gate insulating film 16b is formed to substantially the same width as that of the resist film 50b. In the region for the P channel TFT, the SiO$_2$ film 16 is formed into a gate insulating film 16a covering the semiconductor layer 14II for the P channel TFT and is separated from the region for the N channel TFT.

Figure 1E:
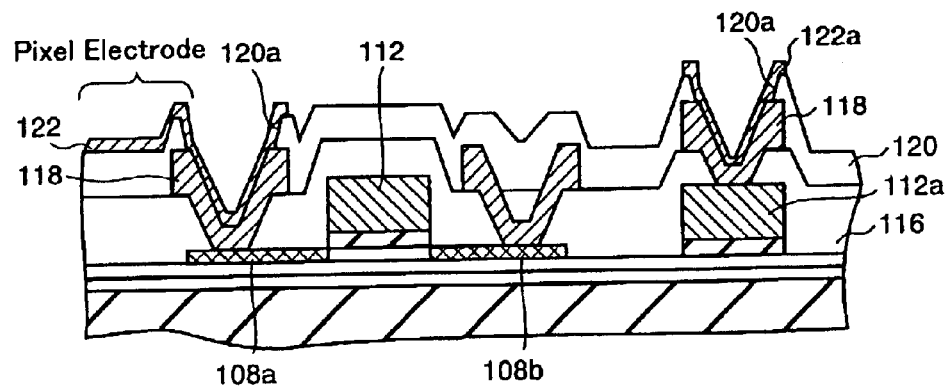
Figure 2A:
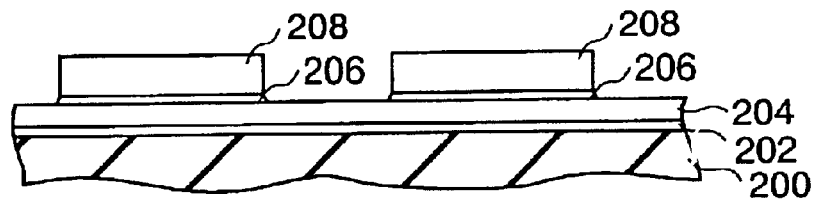
FIGS. 2A to 2I are cross sectional views showing a method of manufacturing a polysilicon TFT substrate according to a prior art (2).
Figure 2B:
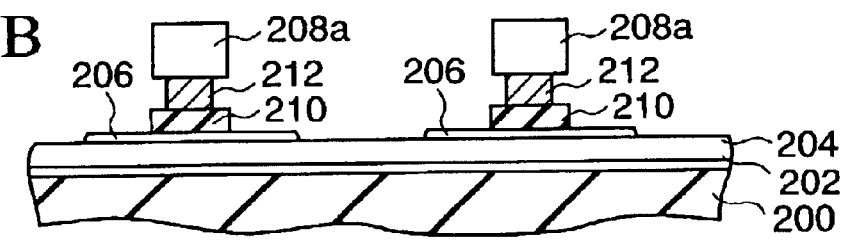
Figure 2C:
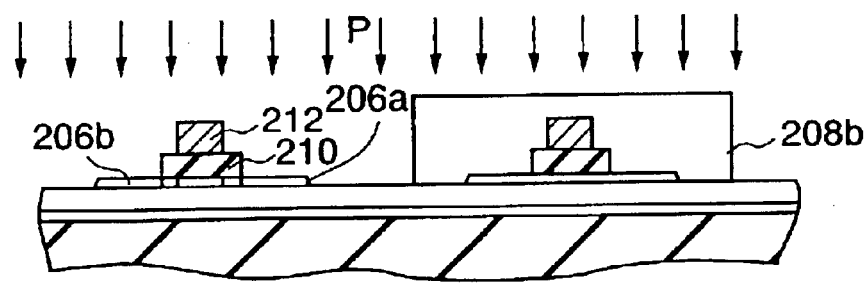
Figure 2D:
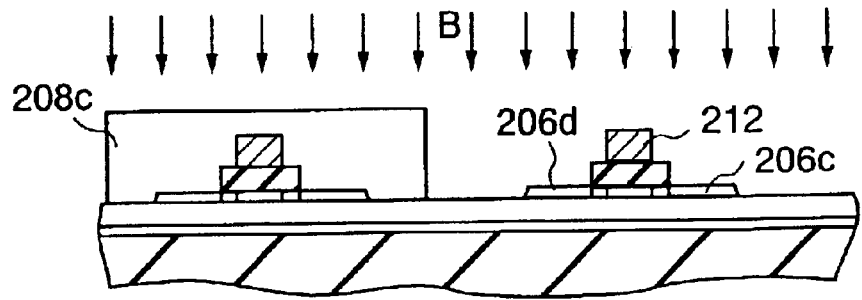
Figure 2E:
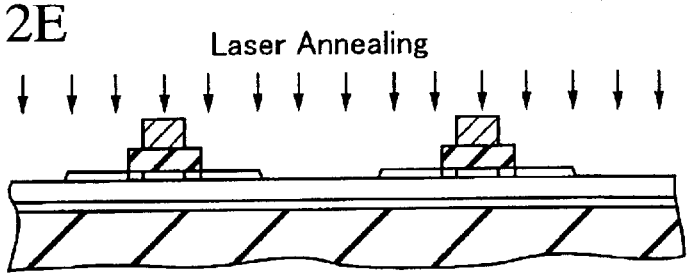
Figure 2F:
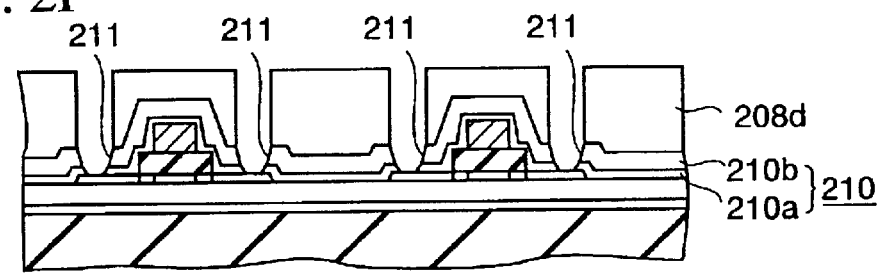
Figure 2G:
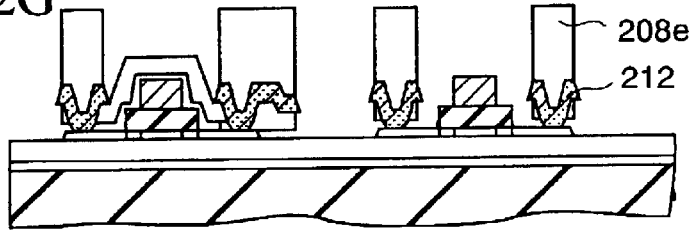
Figure 2H:
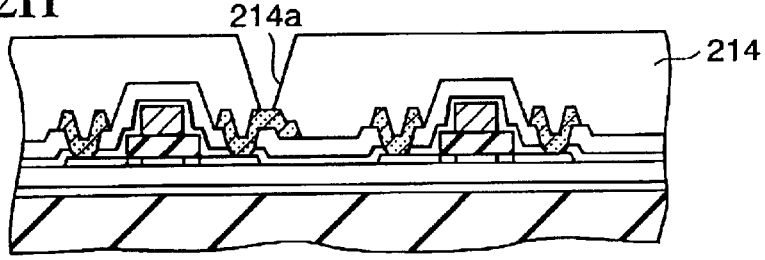
Figure 2I:
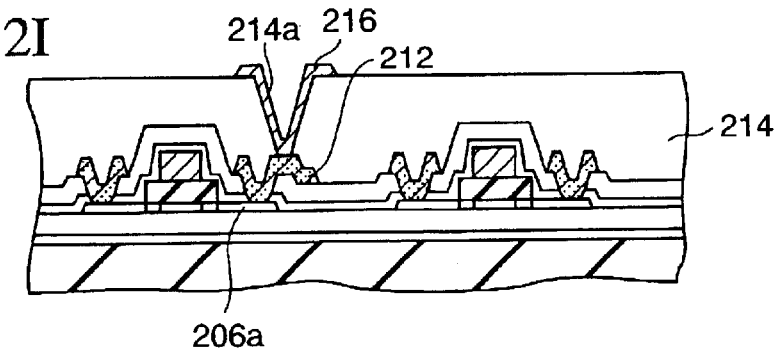
Figure 3A:
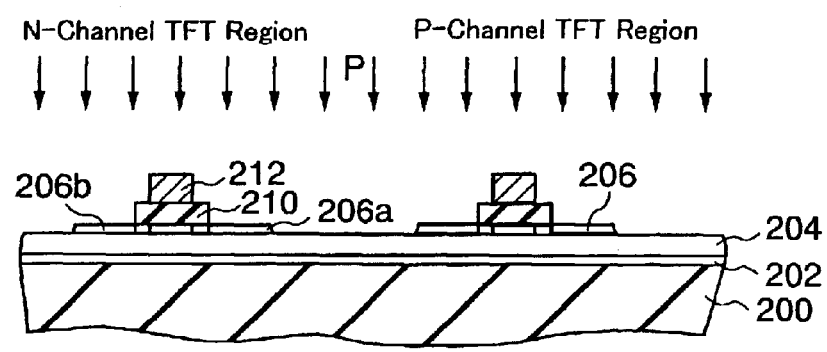
FIGS. 3A and 3B are cross sectional views showing a method of manufacturing a polysilicon TFT substrate according to a prior art (3).
Figure 3B:
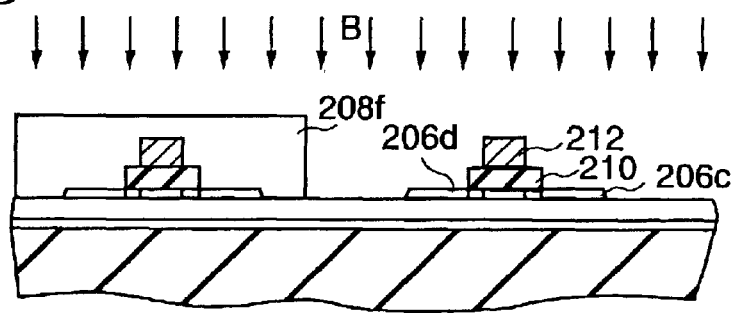
Figure 4:
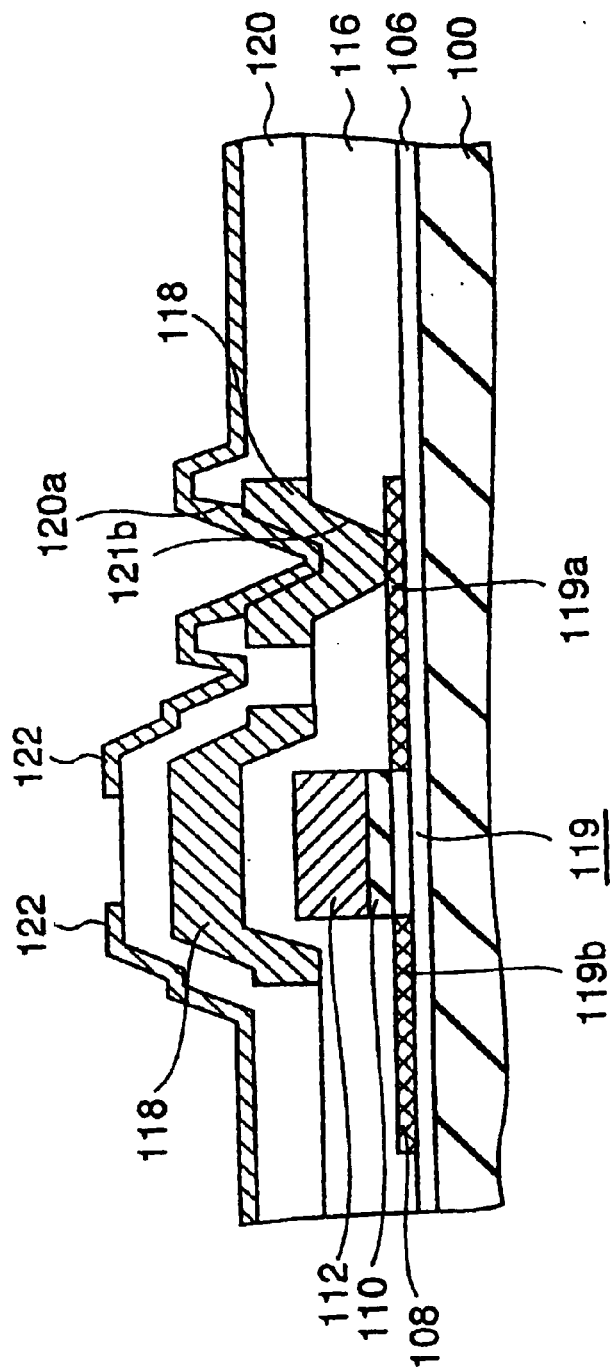
FIG. 4 is a cross sectional view showing an example of bus line light shielding.

Next, after removing the resist film 50b, as shown in FIG. 1E, P+ ions are implanted into the entire surface of the transparent insulating substrate 10 twice by a method similar to the third embodiment, thereby forming a source region 14c and a drain region 14d of the N channel TFT having a LDD structure. At this time, P+ ions are also implanted into the source region 14a and the drain region 14b of the P channel TFT through the gate insulating film 16a. However, since B+ ions are implanted into the of the P channel TFT at the dose about twice as high as the dose of P+ ions, the source region 14a and the drain region 14b remain to be p-type.

Figure 11F:
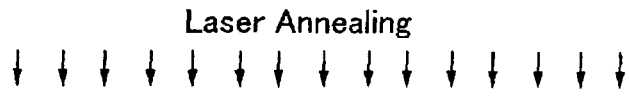

Next, as shown in FIG. 11F, activation of the P+ ions and the B+ ions, which are respectively implanted into the semiconductor layers 14I and 14II, is performed by irradiating excimer laser.

Figure 11G:
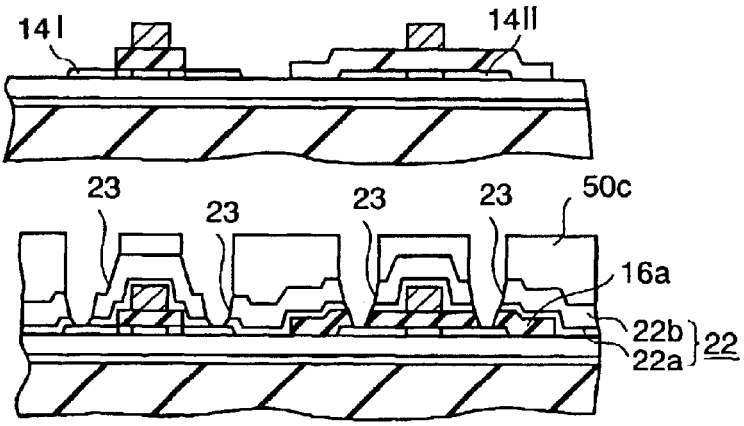

Next, as shown in FIG. 11G, by a method similar to the third embodiment, a first interlayer insulating film 22 made of a SiO$_2$ film 22a and a SiN film 22b is formed, and then the first interlayer insulating film 22 is etched by use of the resist film 50c as a mask, thus forming first contact holes 23. At this time, in the P channel TFT, since the gate insulating film 16a is left under the first interlayer insulating film 22, it is feared that there is excessive overetching of the source region 14c and the drain region 14d of the N channel TFT and therefore a surface portion of the source region 14c and the drain region 14d are etched. Accordingly, in a process of forming the first contact holes 23, it is preferred that the SiO$_2$ film 22a is etched under a condition in which a selection ratio of etching rate (an etching rate of the SiO$_2$ film/an etching rate of the p-Si film) is high.

In the above described manner, as shown in FIG. 11G, the region for the P channel TFT is formed so that regions on the semiconductor layer 14II for the P channel TFT other than portions where the contact holes 23 are formed are covered with the gate insulating film 16a. Meanwhile, in the region for the N channel TFT, there is formed a structure in which the gate insulating film 16b is formed only on a channel region in the semiconductor layer 14I for the N channel TFT under the gate electrode 20b and the LDD structure as a low concentration diffusion region.

Figure 11H:
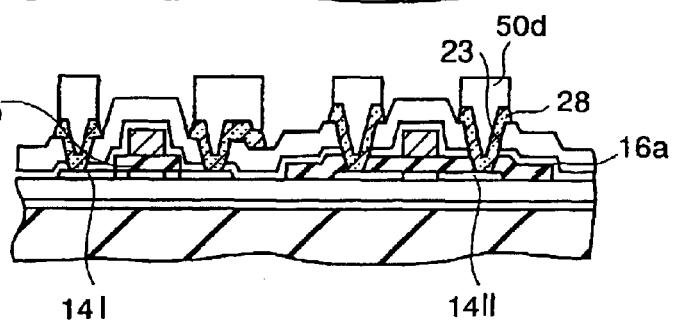

Next, as shown in FIG. 11H, by a method similar to the third embodiment, a metal wiring film is formed, and then the metal wiring film is etched by use of the resist film 50d as a mask, thus forming a interconnection electrode 28.

Figure 11I:
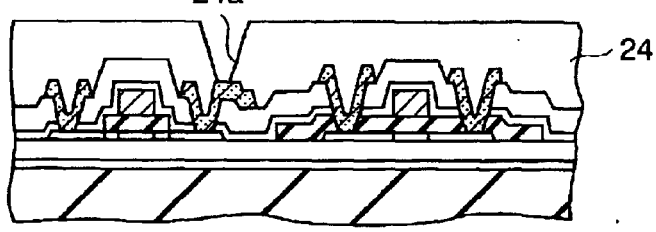
Figure 11J:
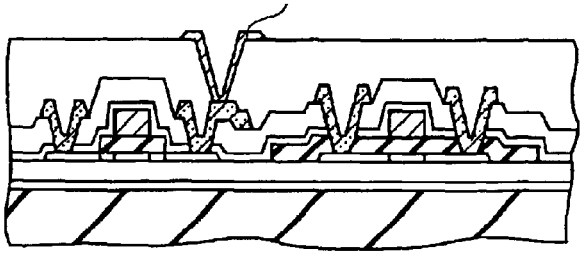

Next, as shown in FIGS. 11I and 11J, by a method similar to the third embodiment, a photosensitive resin interlayer insulating film 24 having a second contact hole 24a is formed on the interconnection electrode 28 connected to the source region 14c of the N channel TFT. Subsequently, a pixel electrode 26, which is connected to the interconnection electrode 28 connected to the source region 14c of the N channel TFT, is formed.

As described above, in the method of manufacturing a polysilicon TFT according to the fourth embodiment, to begin with, the region for the N channel TFT is masked with the covering Al—Nd film 21a, and then the gate electrode 20 of the P channel TFT is formed. At this time, the SiO$_2$ film 16 (the gate insulating film) as an underlayer is not patterned. Next, B+ ions are implanted in a state without a resist film, thus forming the P channel TFT having no LDD structure.

Next, the gate electrode 20b and the gate insulating film 14c of the N channel TFT are formed to collectively constitute a stepwise structure, and then P+ ions are implanted by use of the stepwise structure as a mask, thereby forming the N channel TFT having the LDD structure.

Since a P channel TFT is used mainly for peripheral circuits, the P channel TFT shows no off state leakage, and a P channel TFT is hardly deteriorated due to hot carriers. Accordingly, the P channel TFT does not always require an LDD structure. In the method of manufacturing a thin film transistor substrate according to this embodiment, since an LDD structure is not formed for a P channel TFT, a time for B+ ion implantation is shortened, thereby increasing production efficiency.

Moreover, according to this embodiment, the number of mask processes is reduced by one as compared to the prior art (2). In addition, similarly to the above-described third embodiment, since ion implantation is not performed in a state of using a resist film as a mask, there is no occurrence of the following disadvantage: an altered layer is formed in a surface portion of the resist film due to the ion implantation, and removal of the resist film therefore takes a lot of time.

(Fifth Embodiment)

FIGS. 12A to 12E are cross sectional views showing a method of manufacturing a thin film transistor substrate according to a fifth embodiment of the present invention. In the fifth embodiment, the number of mask processes is reduced by one as compared to the prior art (2) without performing an impurity doping process at a high dose relating to counter doping. For the same processes as those of the third and fourth embodiments, detailed explanation will be omitted.

In the method of manufacturing a thin film transistor substrate of the fifth embodiment, as shown in FIG. 12A, to begin with, the same structure as that of FIG. 10A is obtained by a method similar to the third embodiment.

Thereafter, after removing a resist film 50, a SiO$_2$ film with a thickness of 110 nm, which is to be a gate insulating film, is formed by plasma CVD, and then an Al—Nd film with a thickness of 300 nm is formed by sputtering.

Next, as shown in FIG. 12B, a resist film 60 is patterned on the Al—Nd film, and then the Al—Nd film and the SiO$_2$ film are etched by use of the resist film 60 as a mask, thereby forming a gate electrode 20b and a gate insulating film 16b for an N channel TFT. At this time, the gate electrode 20b is formed so as to be narrowed due to side etching from both edges of the resist film 60, and the gate insulating film 16b is formed to substantially the same width as that of the resist film 60. Simultaneously with the foregoing, in a region for a P channel TFT, a covering film stack 21b made of the Al—Nd film and the SiO$_2$ film is formed, the covering film stack 21b covering a semiconductor layer 14II for the P channel TFT.

Next, as shown in FIG. 12C, after removing the resist film 60, P+ ions are implanted into the entire surface of the transparent insulating substrate 10. For example, P+ ions are implanted into a semiconductor layer 14I for the N channel TFT by use of the gate electrode 20b and the gate insulating film 16b as a mask under conditions that accelerating energy is 10 keV and a dose is 1×10$^{15}$ atoms/cm$^2$.

Subsequently, P+ ions are implanted into the semiconductor layer 14I for the N channel TFT through the gate insulating film 16b by use of the gate electrode 20b as a mask under conditions that accelerating energy is 70 keV and a dose is 5×10$^{13}$ atoms/cm$^2$. Thus, a source region 14c and a drain region 14d of the N channel TFT having an LDD structure are formed. At this time, since the region for the P channel TFT is masked with the covering film stack 21b, impurities are not implanted into the semiconductor layer 14II for the P channel TFT.

Next, as shown in FIG. 12D, a resist film 60a, which covers the region for the N channel TFT and is used for forming a gate electrode of the P channel TFT, is patterned. Then, only the Al—Nd film of the covering film stack 21b is etched by use of the resist film 60a as a mask, thus forming the gate electrode 20 of the P channel TFT.

Next, as shown in FIG. 12E, ashing for a part of the resist film 60a is performed by oxygen-containing plasma so that a width of the resist film 60a for the gate electrode in the region for the P channel TFT is narrower than a width of the gate electrode 20.

Subsequently, in the foregoing state, B+ ions are doped into the semiconductor layer 14II for the P channel TFT through the gate insulating film 16 by use of the gate electrode 20 as a mask under conditions that accelerating energy is 70 keV and a dose is 3×10$^{15}$ atoms/cm$^2$ by using an ion doping system. Thus, a source region 14a and a drain region 14b of the P channel TFT are formed.

Note that, in a case of using conditions that side etching does not occur in the gate electrode 20 in the process of forming the gate electrode 20 by etching shown in FIG. 12D, there is no necessity for ashing the part of the resist film 60a by oxygen-containing plasma. Namely, in the B+ ion implantation process, the gate electrode 20 may be substantially used as a mask.

By performing the ion doping in this way, in the region for the P channel TFT, since B+ ions are doped in portions of the semiconductor layer 14II for the P channel TFT which are outside both edges of the gate electrode 20, an offset structure is not formed. In addition, in the region for the P channel TFT, since the gate insulating film 16 is formed so as to cover the semiconductor layer 14II for the P channel TFT, an LDD structure is not formed.

Next, after removing the resist film 60a, by a method similar to the method of the above-described fourth embodiment shown in FIGS. 11F to 11J, a thin film transistor substrate can be manufactured.

As described above, in the method of manufacturing a thin film transistor substrate of the fifth embodiment, P+ ion implantation is first performed by use of a stepwise structure composed of the gate electrode 20b and the gate insulating film 16b as a mask in a state where the region for the P channel TFT is covered with the covering film stack 21b, thereby forming the N channel TFT having the LDD structure.

Next, the region for the N channel TFT is masked, and the resist film 60a for forming the gate electrode of the P channel TFT is patterned. Then, only the Al—Nd film of the covering film stack 21b is etched to form the gate electrode 20. At this time, in a case where the gate electrode 20 is formed so as to be narrowed due to side etching with respect to the resist film, ashing of a part of the resist film is performed so that sides of the gate electrode 20 is bared when viewed from a top portion thereof.

Subsequently, in a state where the resist film 60a is made to be left, B+ ion implantation is performed so that B+ ions are doped into portions of the semiconductor layer 14II for the P channel TFT which are outside the both edges of the gate electrode 20 of the P channel TFT, thus forming the P channel TFT having no LDD structure.

The method described above eliminates the necessity of performing high dose impurity doping in order to perform counter doping. Moreover, since an LDD structure is not formed for the P channel TFT, a time for impurity doping can be shortened. Furthermore, the number of mask processes can be reduced by one as compared to the prior art (2).

What is claimed is:

1. A method of manufacturing a thin film transistor substrate comprising the steps of:

forming a pattern of a semiconductor layer on or above an insulating substrate;

forming a gate insulating film on the semiconductor layer;

forming a gate electrode on the gate insulating film;

introducing impurities into portions of the semiconductor layer, which are to be a source region and a drain region;

forming an interlayer insulating film including a plurality of insulating films with mutually different dielectric constants on the semiconductor layer and the gate electrode;

forming contact holes in portions of the interlayer insulating film, the portions being at least on the source region and the drain region;

forming a transparent conductive film on the interlayer insulating film and inner surfaces of the contact holes;

forming a metal film on the transparent conductive film;

forming a interconnection electrode in a portion including the contact hole of the drain region by patterning the metal film while using the transparent conductive film as an etch stop layer; and forming a pixel electrode connected to the source region through the contact hole and forming the interconnection electrode connected to the drain region through the transparent conductive film in the contact hole by patterning the transparent conductive film.

2. A method of manufacturing a thin film transistor substrate comprising the steps of:

forming a pattern of a semiconductor layer on or above an insulating substrate;

forming a gate insulating film on the semiconductor layer;

forming a gate electrode on the gate insulating film;

introducing impurities into portions of the semiconductor layer, which are to be a source region and a drain region;

forming an interlayer insulating film including a plurality of insulating films with mutually different dielectric constants on the semiconductor layer and the gate electrode;

forming contact holes in portions of the interlayer insulating film, the portions being at least on the source region and the drain region;

forming a transparent conductive film on the interlayer insulating film and inner surfaces of the contact holes;

forming a metal film on the transparent conductive film;

forming a pattern of a resist film on the metal film so that a thickness of a portion for a formation of a pixel electrode connected with the source region is thinner than a thickness of a portion for a formation of a interconnection electrode connected with the drain region;

forming the interconnection electrode by etching the metal film and the transparent conductive film while using the resist film as a mask;

selectively removing the portion of the resist film for the formation of the pixel electrode and leaving the portion of the resist film for the formation of the interconnection electrode; and forming the pixel electrode by etching a portion of the metal film where the pixel electrode is formed while using the portion of the resist film for the formation of the interconnection electrode as a mask and using the transparent conductive film as an etch stop layer.

3. A method of manufacturing a thin film transistor substrate, comprising the steps of:

forming patterns of a semiconductor layer for a one conductivity type channel transistor and a semiconductor layer for a opposite conductivity type channel transistor on or above an insulating substrate;

forming a gate insulating film on the semiconductor layers;

forming a conductive film, which is to be gate electrodes, on the gate insulating film;

forming a structure in which a gate insulating film for the opposite conductivity type channel transistor and the gate electrode for the opposite conductivity type channel transistor, the gate electrode having a narrower width than a width of the gate insulating film for the opposite conductivity type channel transistor, are stacked from bottom to top on the semiconductor layer for the opposite conductivity type channel transistor, and forming a pattern of a covering film stack in which a gate insulating film and a conductive film are stacked, the covering film stack covering all of the semiconductor layer for the one conductivity type channel transistor, by patterning the conductive film and the gate insulating film;

forming predetermined source and drain regions for the opposite conductivity type channel transistor by introducing impurities of the opposite conductivity type into the semiconductor layer for the opposite conductivity type channel transistor while using at least anyone of the gate electrode for the opposite conductivity type channel transistor and the gate insulating film therefore as a mask;

forming a structure in which a gate insulating film for the one conductivity type channel transistor and the gate electrode for the one conductivity type channel transistor, the gate electrode having a narrower width than a width of the gate insulating film for the one conductivity type channel transistor, are stacked from bottom to top, by patterning the covering film stack; and forming predetermined source and drain regions for the one conductivity type channel transistor by introducing impurities of the one conductivity type into the semiconductor layer for the one conductivity type channel transistor while using at least anyone of the gate electrode for the one conductivity type channel transistor and the gate insulating film therefor as a mask.

4. A method of manufacturing a thin film transistor substrate comprising the steps of:

forming patterns of a semiconductor layer for a one conductivity type channel transistor and a semiconductor layer for a opposite conductivity type channel transistor on or above an insulating substrate;

forming a gate insulating film on the semiconductor layers;

forming a conductive film, which is to be gate electrodes, on the gate insulating film;

forming the gate electrode for the opposite conductivity type channel transistor on the semiconductor layer for the opposite conductivity type channel transistor, and forming a pattern of a covering conductive film which covers all of the semiconductor layer for the one conductivity type channel transistor by patterning the conductive film;

forming a source region and a drain region for the opposite conductivity type channel transistor by introducing impurities of the opposite conductivity type into the semiconductor layer for the opposite conductivity type channel transistor through the gate insulating film while using the gate electrode for the opposite conductivity type channel transistor as a mask;

forming a structure in which a gate insulating film for the one conductivity type channel transistor and the gate electrode for the one conductivity type channel transistor, the gate electrode having a narrower width than a width of the gate insulating film for the one conductivity type channel transistor, are stacked from bottom to top, by patterning the covering conductive film and the gate insulating film; and forming predetermined source and drain regions for the one conductivity type channel transistor, by introducing impurities of the one conductivity type into the semiconductor layer for the one conductivity type channel transistor while using at least anyone of the gate electrode for the one conductivity type channel transistor and the gate insulating film therefor as a mask.

5. A method of manufacturing a thin film transistor substrate comprising the steps of:

forming patterns of a semiconductor layer for a one conductivity type channel transistor and a semiconductor layer for a opposite conductivity type channel transistor on or above an insulating substrate;

forming a gate insulating film on the semiconductor layers;

forming a conductive film, which is to be gate electrodes, on the gate insulating film;

forming a structure in which a gate insulating film for the one conductivity type channel transistor and the gate electrode for the one conductivity type channel transistor having a narrower width than a width of the gate insulating film for the one conductivity type channel transistor are stacked from bottom to top on the semiconductor layer for the one conductivity type channel transistor, and forming a pattern of a covering film stack in which a gate insulating film and a conductive film are stacked, the covering film stack covering all of the semiconductor layer for the opposite conductivity type channel transistor, by patterning the conductive film and the gate insulating film;

forming a source region and a drain region for the one conductivity type channel transistor by introducing impurities of the one conductivity type into the semiconductor layer for the one conductivity type channel transistor while using at least anyone of the gate electrode for the one conductivity type channel transistor and the gate insulating film therefore as a mask;

patterning a resist film delimiting a region for forming the gate electrode for the opposite conductivity type channel transistor on the covering film stack and covering the semiconductor layer for the one conductivity type channel transistor and the gate electrode therefore;

forming the gate electrode for the opposite conductivity type channel transistor, the gate electrode having a predetermined width equal to or wider than a width of the resist film by etching the covering film stack while using the resist film as a mask; and forming source and drain regions for the opposite conductivity type channel transistor by introducing impurities of the opposite conductivity type into the semiconductor layer for the opposite conductivity type channel transistor while using at least anyone of the resist film and the gate electrode for the opposite conductivity type channel transistor as a mask.

* * * * *